United States Patent
Khlat

(10) Patent No.: US 9,020,451 B2
(45) Date of Patent: *Apr. 28, 2015

(54) PROGRAMMABLE RF NOTCH FILTER FOR ENVELOPE TRACKING

(71) Applicant: RF Micro Devices, Inc., Greensboro, NC (US)

(72) Inventor: Nadim Khlat, Cugnaux (FR)

(73) Assignee: RF Micro Devices, Inc., Greensboro, NC (US)

(*) Notice: Subject to any disclaimer, the term of this patent is extended or adjusted under 35 U.S.C. 154(b) by 0 days.

This patent is subject to a terminal disclaimer.

(21) Appl. No.: 13/951,976

(22) Filed: Jul. 26, 2013

(65) Prior Publication Data

US 2014/0028368 A1    Jan. 30, 2014

Related U.S. Application Data

(60) Provisional application No. 61/675,898, filed on Jul. 26, 2012.

(51) Int. Cl.
*H01Q 11/12* (2006.01)
*H04B 1/04* (2006.01)
(Continued)

(52) U.S. Cl.
CPC ......... *H03H 21/0021* (2013.01); *H03F 1/0227* (2013.01); *H03F 2200/432* (2013.01); *H03F 3/195* (2013.01); *H03F 3/245* (2013.01); *H03F 2200/555* (2013.01); *H03H 7/0107* (2013.01); *H03H 7/0153* (2013.01); *H03H 2007/013* (2013.01)

(58) Field of Classification Search
CPC ................... H04W 52/0209; H04W 52/0261; H04W 52/28; H04B 2001/0408; H04B 2001/0416; H03G 3/3042
USPC ........ 455/571–572, 127.1–127.5; 330/124 R, 330/125, 132; 323/234, 271–272, 280–282
See application file for complete search history.

(56) References Cited

U.S. PATENT DOCUMENTS 3,969,682 A    7/1976    Rossum
3,980,964 A    9/1976    Grodinsky
(Continued)

FOREIGN PATENT DOCUMENTS

CN    1211355 A    3/1999
CN    1898860 A    1/2007
(Continued)

OTHER PUBLICATIONS

Notice of Allowance for U.S. Appl. No. 13/188,024, mailed Jun. 18, 2013, 7 pages.
(Continued)

*Primary Examiner* — Simon Nguyen
(74) *Attorney, Agent, or Firm* — Withrow & Terranova, P.L.L.C.

(57) ABSTRACT

A parallel amplifier, a switching supply, and a radio frequency (RF) notch filter are disclosed. The parallel amplifier has a parallel amplifier output, such that the switching supply is coupled to the parallel amplifier output. Further, the RF notch filter is coupled between the parallel amplifier output and a ground. The RF notch filter has a selectable notch frequency, which is based on an RF duplex frequency.

22 Claims, 17 Drawing Sheets

(51) Int. Cl.
*H03H 21/00* (2006.01)
*H03F 1/02* (2006.01)
*H03F 3/195* (2006.01)
*H03F 3/24* (2006.01)
*H03H 7/01* (2006.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 * | 11/2002 | Hwang ............ 323/299 |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 * | 10/2005 | Sferrazza et al. ............ 323/303 |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 * | 4/2007 | Watanabe et al. ............ 455/82 |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 * | 10/2007 | Gan et al. ............ 323/282 |
| 7,348,847 B2 | 3/2008 | Whittaker |
| 7,394,233 B1 * | 7/2008 | Trayling et al. ............ 323/272 |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 * | 3/2011 | Bernardon et al. ............ 324/713 |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 * | 9/2013 | Notman et al. ............ 323/271 |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 * | 10/2003 | Smyth ............ 363/21.1 |

(56) References Cited

U.S. PATENT DOCUMENTS

| | | | |
|---|---|---|---|
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0051384 A1 | 3/2004 | Jackson et al. | |
| 2004/0124913 A1 | 7/2004 | Midya et al. | |
| 2004/0132424 A1 | 7/2004 | Aytur et al. | |
| 2004/0184569 A1 | 9/2004 | Challa et al. | |
| 2004/0196095 A1 | 10/2004 | Nonaka | |
| 2004/0219891 A1 | 11/2004 | Hadjichristos | |
| 2004/0239301 A1* | 12/2004 | Kobayashi | 323/284 |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0079835 A1 | 4/2005 | Takabayashi et al. | |
| 2005/0093630 A1 | 5/2005 | Whittaker et al. | |
| 2005/0110562 A1 | 5/2005 | Robinson et al. | |
| 2005/0122171 A1 | 6/2005 | Miki et al. | |
| 2005/0156582 A1* | 7/2005 | Redl et al. | 323/282 |
| 2005/0156662 A1 | 7/2005 | Raghupathy et al. | |
| 2005/0157778 A1 | 7/2005 | Trachewsky et al. | |
| 2005/0200407 A1* | 9/2005 | Arai et al. | 330/133 |
| 2005/0286616 A1 | 12/2005 | Kodavati | |
| 2006/0006946 A1* | 1/2006 | Burns et al. | 330/295 |
| 2006/0062324 A1 | 3/2006 | Naito et al. | |
| 2006/0097711 A1* | 5/2006 | Brandt | 323/282 |
| 2006/0128324 A1 | 6/2006 | Tan et al. | |
| 2006/0154637 A1 | 7/2006 | Eyries et al. | |
| 2006/0178119 A1 | 8/2006 | Jarvinen | |
| 2006/0181340 A1 | 8/2006 | Dhuyvetter | |
| 2006/0220627 A1* | 10/2006 | Koh | 323/282 |
| 2006/0244513 A1 | 11/2006 | Yen et al. | |
| 2007/0008804 A1 | 1/2007 | Lu et al. | |
| 2007/0014382 A1 | 1/2007 | Shakeshaft et al. | |
| 2007/0024360 A1 | 2/2007 | Markowski | |
| 2007/0063681 A1 | 3/2007 | Liu | |
| 2007/0082622 A1* | 4/2007 | Leinonen et al. | 455/78 |
| 2007/0146076 A1* | 6/2007 | Baba | 330/297 |
| 2007/0182392 A1* | 8/2007 | Nishida | 323/282 |
| 2007/0183532 A1 | 8/2007 | Matero | |
| 2007/0259628 A1 | 11/2007 | Carmel et al. | |
| 2007/0290749 A1 | 12/2007 | Woo et al. | |
| 2008/0003950 A1 | 1/2008 | Haapoja et al. | |
| 2008/0044041 A1 | 2/2008 | Tucker et al. | |
| 2008/0081572 A1 | 4/2008 | Rofougaran | |
| 2008/0104432 A1 | 5/2008 | Vinayak et al. | |
| 2008/0150619 A1 | 6/2008 | Lesso et al. | |
| 2008/0205095 A1 | 8/2008 | Pinon et al. | |
| 2008/0242246 A1 | 10/2008 | Minnis et al. | |
| 2008/0252278 A1 | 10/2008 | Lindeberg et al. | |
| 2008/0258831 A1 | 10/2008 | Kunihiro et al. | |
| 2008/0280577 A1 | 11/2008 | Beukema et al. | |
| 2009/0004981 A1 | 1/2009 | Eliezer et al. | |
| 2009/0097591 A1 | 4/2009 | Kim | |
| 2009/0160548 A1 | 6/2009 | Ishikawa et al. | |
| 2009/0167260 A1 | 7/2009 | Pauritsch et al. | |
| 2009/0174466 A1 | 7/2009 | Hsieh et al. | |
| 2009/0184764 A1 | 7/2009 | Markowski et al. | |
| 2009/0190699 A1 | 7/2009 | Kazakevich et al. | |
| 2009/0191826 A1 | 7/2009 | Takinami et al. | |
| 2009/0218995 A1 | 9/2009 | Ahn | |
| 2009/0230934 A1 | 9/2009 | Hooijschuur et al. | |
| 2009/0261908 A1 | 10/2009 | Markowski | |
| 2009/0284235 A1 | 11/2009 | Weng et al. | |
| 2009/0289720 A1 | 11/2009 | Takinami et al. | |
| 2009/0319065 A1 | 12/2009 | Risbo | |
| 2010/0001793 A1 | 1/2010 | Van Zeijl et al. | |
| 2010/0002473 A1 | 1/2010 | Williams | |
| 2010/0019749 A1 | 1/2010 | Katsuya et al. | |
| 2010/0019840 A1 | 1/2010 | Takahashi | |
| 2010/0026250 A1 | 2/2010 | Petty | |
| 2010/0045247 A1* | 2/2010 | Blanken et al. | 323/273 |
| 2010/0171553 A1 | 7/2010 | Okubo et al. | |
| 2010/0253309 A1* | 10/2010 | Xi et al. | 323/288 |
| 2010/0266066 A1 | 10/2010 | Takahashi | |
| 2010/0301947 A1 | 12/2010 | Fujioka et al. | |
| 2010/0308654 A1* | 12/2010 | Chen | 307/31 |
| 2010/0311365 A1 | 12/2010 | Vinayak et al. | |
| 2010/0321127 A1 | 12/2010 | Watanabe et al. | |
| 2010/0327825 A1 | 12/2010 | Mehas et al. | |
| 2011/0018626 A1 | 1/2011 | Kojima | |
| 2011/0058601 A1 | 3/2011 | Kim et al. | |
| 2011/0084760 A1 | 4/2011 | Guo et al. | |
| 2011/0148375 A1 | 6/2011 | Tsuji | |
| 2011/0234182 A1* | 9/2011 | Wilson | 323/234 |
| 2011/0235827 A1 | 9/2011 | Lesso et al. | |
| 2011/0279180 A1* | 11/2011 | Yamanouchi et al. | 330/207 R |
| 2011/0298539 A1 | 12/2011 | Drogi et al. | |
| 2012/0025907 A1 | 2/2012 | Koo et al. | |
| 2012/0025919 A1* | 2/2012 | Huynh | 331/34 |
| 2012/0034893 A1 | 2/2012 | Baxter et al. | |
| 2012/0049953 A1 | 3/2012 | Khlat | |
| 2012/0068767 A1 | 3/2012 | Henshaw et al. | |
| 2012/0074916 A1 | 3/2012 | Trochut | |
| 2012/0133299 A1 | 5/2012 | Capodivacca et al. | |
| 2012/0139516 A1 | 6/2012 | Tsai et al. | |
| 2012/0154035 A1 | 6/2012 | Hongo et al. | |
| 2012/0154054 A1 | 6/2012 | Kaczman et al. | |
| 2012/0170334 A1 | 7/2012 | Menegoli et al. | |
| 2012/0176196 A1 | 7/2012 | Khlat | |
| 2012/0194274 A1* | 8/2012 | Fowers et al. | 330/293 |
| 2012/0200354 A1 | 8/2012 | Ripley et al. | |
| 2012/0236444 A1 | 9/2012 | Srivastava et al. | |
| 2012/0244916 A1 | 9/2012 | Brown et al. | |
| 2012/0299647 A1 | 11/2012 | Honjo et al. | |
| 2013/0034139 A1 | 2/2013 | Khlat et al. | |
| 2013/0094553 A1 | 4/2013 | Paek et al. | |
| 2013/0169245 A1* | 7/2013 | Kay et al. | 323/234 |
| 2013/0214858 A1 | 8/2013 | Tournatory et al. | |
| 2013/0229235 A1 | 9/2013 | Ohnishi | |
| 2013/0307617 A1 | 11/2013 | Khlat et al. | |
| 2013/0328613 A1 | 12/2013 | Kay et al. | |
| 2014/0009200 A1 | 1/2014 | Kay et al. | |
| 2014/0009227 A1 | 1/2014 | Kay et al. | |

FOREIGN PATENT DOCUMENTS

| | | |
|---|---|---|
| CN | 101201891 A | 6/2008 |
| CN | 101416385 A | 4/2009 |
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

International Preliminary Report on Patentability for PCT/US2011/054106 mailed Apr. 11, 2013, 8 pages.

(56) References Cited

OTHER PUBLICATIONS

International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
International Preliminary Report on Patentability for PCT/US2012/024124, mailed Aug. 22, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Notice of Allowance for U.S. Appl. No. 131602,856, mailed Sep. 24, 2013, 9 pages.
Quayle Action for U.S. Appl. No. 13/531,719, mailed Oct. 10, 2013, 5 pages.
Non-Final Office Action for U.S. Appl. No. 12/836,307, mailed Nov. 5, 2013, 6 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Examination Report for European Patent Application No. 11720630, mailed Aug. 16, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, a. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm²at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=n. ujira%20 Files% 20100th°/020Envelope%20Tracking°/020Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Nov. 1, 2012, 7 pages.
Non-Final Office Action for U.S. Appl. No. 13/188,024, mailed Feb. 5, 2013, 8 pages.

(56) References Cited

OTHER PUBLICATIONS

International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Invitation to Pay Additional Fees for PCT/US2011/061007, mailed Feb. 13, 2012, 7 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al, "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pp.
Examination Report for European Patent Application No. 11720630.0 issued Mar. 18, 2014, 4 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Notice of Allowance for U.S. Appl. No. 12/836,307 mailed May 5, 2014, 6 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.

(56) References Cited

OTHER PUBLICATIONS

Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Non-Final Office Action for U.S. Appl. No. 13/747,749, mailed Nov. 12, 2014, 32 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
First Office Action for Chinese Patent Application No. 201280026559.0, issued Nov. 3, 2014, 14 pages (with English translation).
European Search Report for European Patent Application No. 14190851.7, issued Mar. 5, 2015, 6 pages.

\* cited by examiner

US 9,020,451 B2

PROGRAMMABLE RF NOTCH FILTER FOR ENVELOPE TRACKING

RELATED APPLICATIONS

This application claims the benefit of U.S. provisional patent application No. 61/675,898, filed Jul. 26, 2012, the disclosure of which is incorporated herein by reference in its entirety.

FIELD OF THE DISCLOSURE

The present disclosure relates to direct current (DC)-DC converters and circuits that use DC-DC converters.

BACKGROUND

DC-DC converters often include switching power supplies, which may be based on switching at least one end of an energy storage element, such as an inductor, between a source of DC voltage and a ground. As a result, an output voltage from a DC-DC converter may have a ripple voltage resulting from the switching associated with the energy storage element. Typically, the ripple voltage is undesirable and is minimized as much as sizes and costs permit. Thus, there is a need to minimize ripple voltage using techniques that minimize sizes and costs.

SUMMARY

A parallel amplifier, a switching supply, and a radio frequency (RF) notch filter are disclosed. The parallel amplifier has a parallel amplifier output, such that the switching supply is coupled to the parallel amplifier output. Further, the RF notch filter is coupled between the parallel amplifier output and a ground. The RF notch filter has a selectable notch frequency, which is based on an RF duplex frequency.

In one embodiment of the present disclosure, the parallel amplifier and the switching supply combine to provide a first envelope power supply signal to an RF power amplifier (PA), such that the first envelope power supply signal at least partially envelope tracks an RF transmit signal, which is provided by the RF PA. In one embodiment of the RF notch filter, the RF notch filter reduces noise introduced by the first envelope power supply signal into RF receive circuitry. As such, the selectable notch frequency is selected to target specific receive frequencies.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
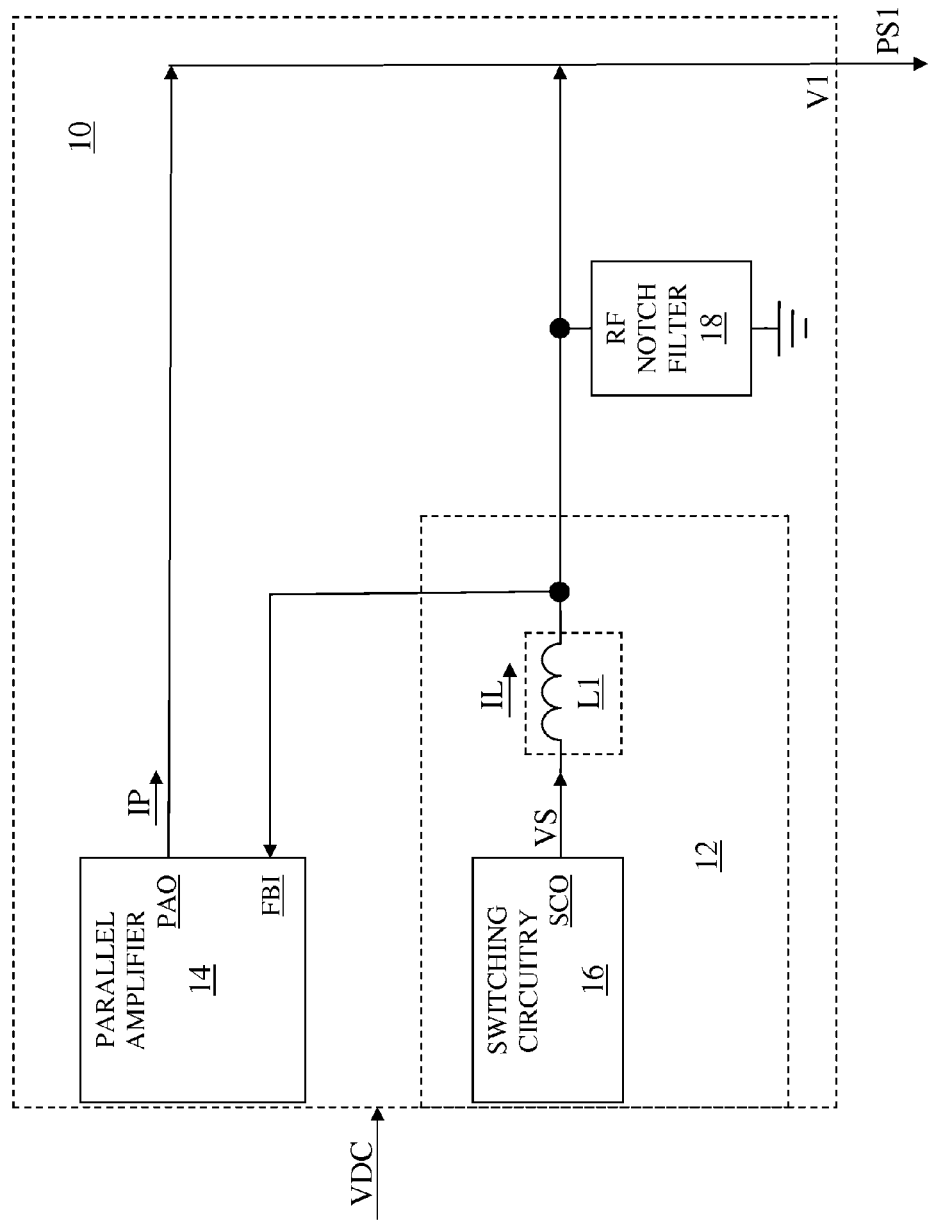
FIG. 1 shows a direct current (DC)-DC converter according to one embodiment of the present disclosure.

FIG. 1 shows a direct current (DC)-DC converter 10 according to one embodiment of the present disclosure. The DC-DC converter 10 includes a switching supply 12, a parallel amplifier 14, and a radio frequency (RF) notch filter 18. The switching supply 12 includes switching circuitry 16 and a first inductive element L1. The parallel amplifier 14 has a feedback input FBI and a parallel amplifier output PAO. In general, the switching supply 12 is coupled to the parallel amplifier output PAO. The switching circuitry 16 has a switching circuitry output SCO. The first inductive element L1 is coupled between the switching circuitry output SCO and the feedback input FBI. The RF notch filter 18 is coupled between the parallel amplifier output PAO and a ground. In one embodiment of the DC-DC converter 10, the parallel amplifier output PAO is directly coupled to the feedback input FBI, as shown.

In one embodiment of the DC-DC converter 10, the parallel amplifier 14 partially provides a first power supply output signal PS1 via the parallel amplifier output PAO based on a voltage setpoint. The switching supply 12 partially provides the first power supply output signal PS1 via the first inductive element L1. The switching supply 12 may provide power more efficiently than the parallel amplifier 14. However, the parallel amplifier 14 may provide a voltage of the first power supply output signal PS1 more accurately than the switching supply 12. As such, in one embodiment of the DC-DC converter 10, the parallel amplifier 14 regulates the voltage, called a first voltage V1, of the first power supply output signal PS1 based on the voltage setpoint of the first power supply output signal PS1. Further, the switching supply 12 regulates the first power supply output signal PS1 to minimize an output current, called a parallel amplifier output current IP, from the parallel amplifier 14 to maximize efficiency. In this regard, the parallel amplifier 14 behaves like a voltage source and the switching supply 12 behaves like a current source. Additionally, the switching circuitry 16 provides a switching output voltage VS and an inductor current IL to the first inductive element L1 via the switching circuitry output SCO.

In one embodiment of the DC-DC converter 10, the DC-DC converter 10 receives a DC source signal VDC, such that the parallel amplifier 14 partially provides the first power supply output signal PS1 using the DC source signal VDC and the switching supply 12 partially provides the first power supply output signal PS1 using the DC source signal VDC.

Figure 2:
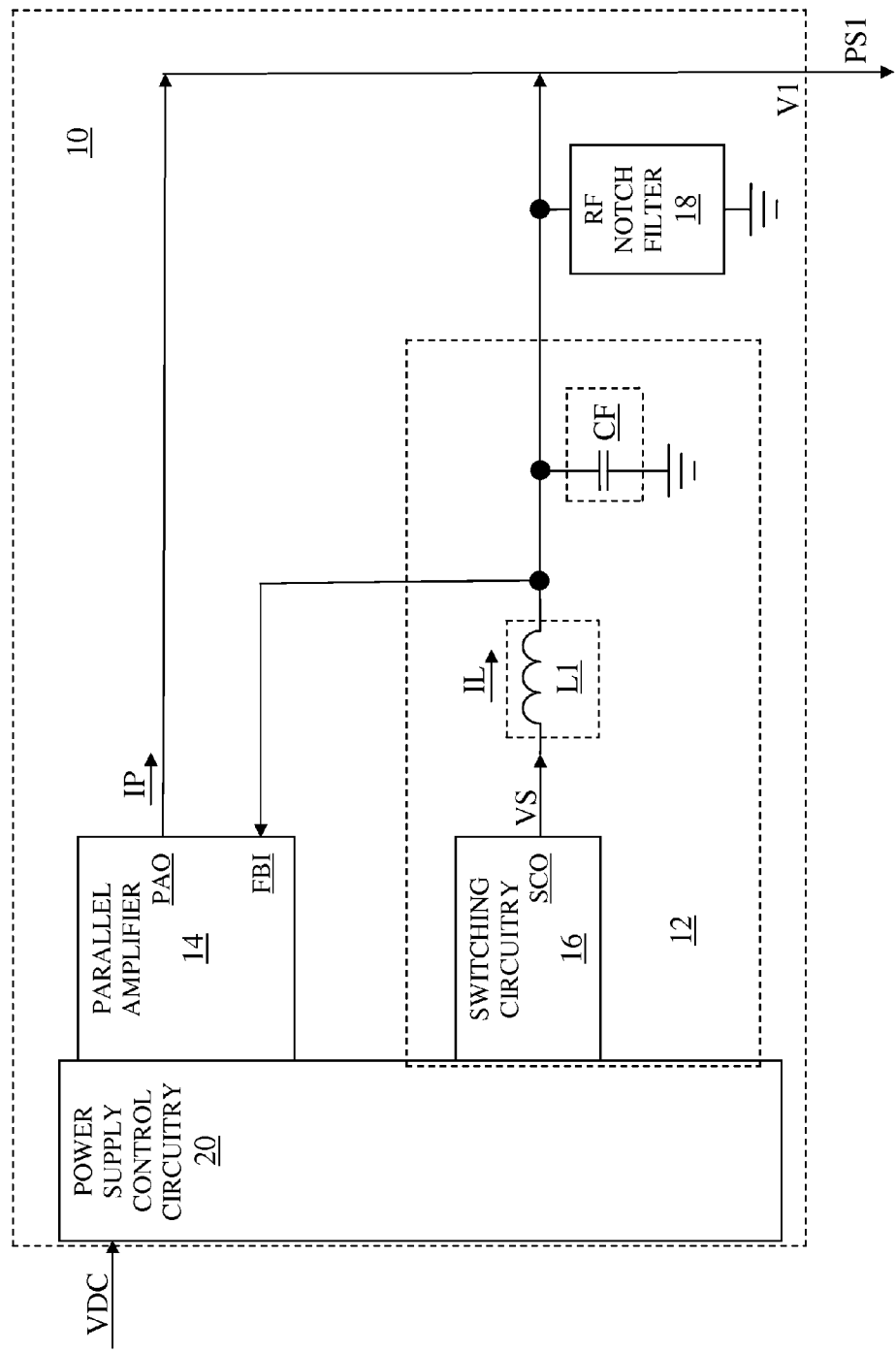
FIG. 2 shows the DC-DC converter according to an alternate embodiment of the DC-DC converter.

FIG. 2 shows the DC-DC converter 10 according to an alternate embodiment of the DC-DC converter 10. The DC-DC converter 10 illustrated in FIG. 2 is similar to the DC-DC converter 10 illustrated in FIG. 1, except the DC-DC converter 10 illustrated in FIG. 2 further includes power supply control circuitry 20 and the switching supply 12 further includes a filter capacitive element CF. The filter capacitive element CF is coupled between the parallel amplifier output PAO and the ground. As such, the filter capacitive element CF may significantly reduce unwanted noise, ripple, or both from the first power supply output signal PS1. The power supply control circuitry 20 receives the DC source signal VDC and is coupled to the parallel amplifier 14 and the switching circuitry 16.

Figure 3:
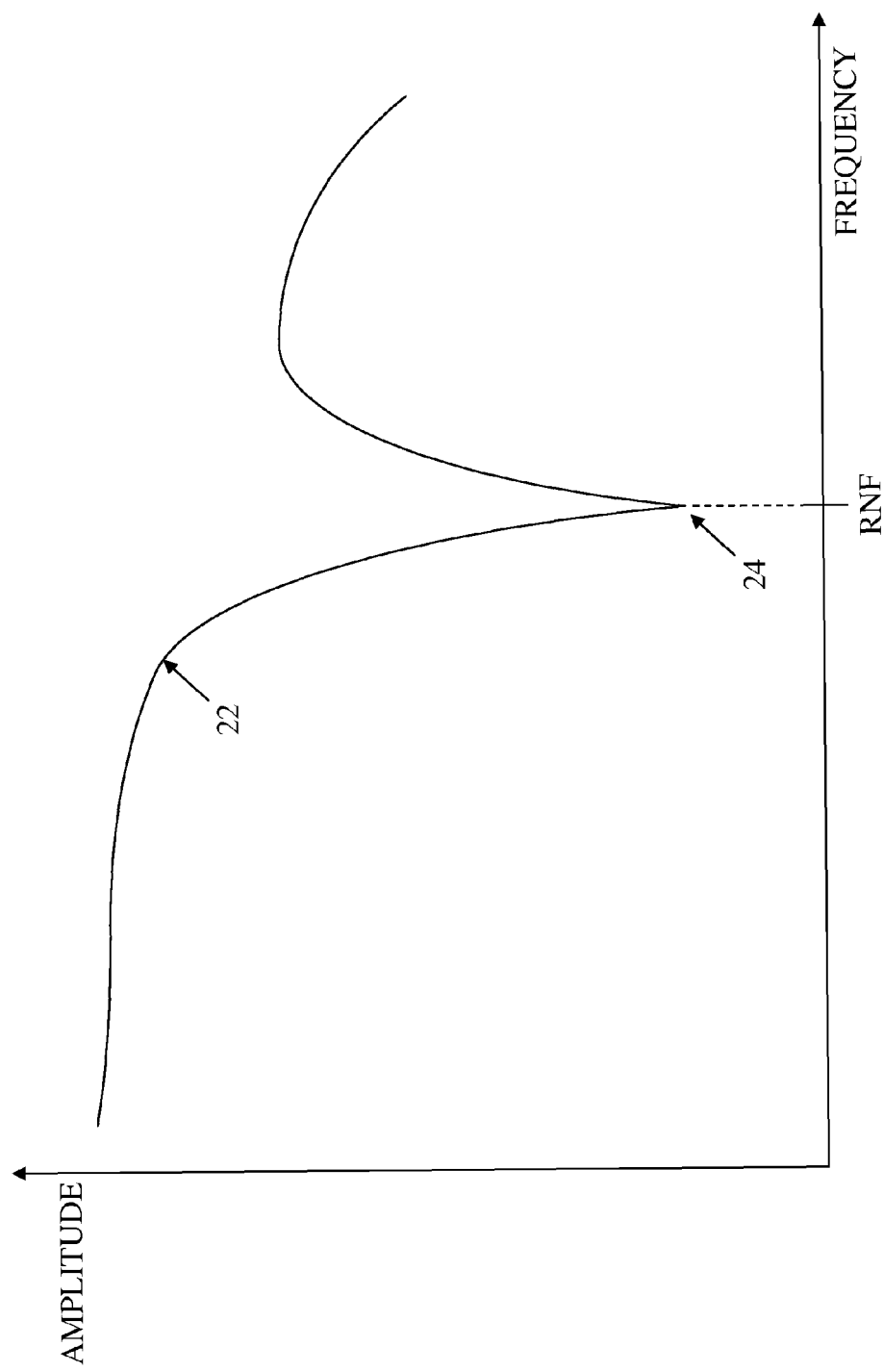
FIG. 3 is a graph illustrating a frequency response of a radio frequency (RF) notch filter illustrated in FIG. 1 according to an additional embodiment of the DC-DC converter.

FIG. 3 is a graph illustrating a frequency response 22 of the RF notch filter 18 (FIG. 1) illustrated in FIG. 1 according to an additional embodiment of the DC-DC converter 10. The RF notch filter 18 (FIG. 1) has the frequency response 22 with an RF notch 24 at an RF notch frequency RNF. Therefore, the RF notch filter 18 (FIG. 1) filters the first power supply output signal PS1 (FIG. 1) based on the frequency response 22. As such, the RF notch filter 18 (FIG. 1) may significantly reduce unwanted noise, ripple, or both from the first power supply output signal PS1 (FIG. 1) at the RF notch frequency RNF. In one embodiment of the RF notch filter 18 (FIG. 1), the RF notch filter 18 (FIG. 1) is a programmable RF notch filter, such that the RF notch frequency RNF is a selectable notch frequency. In an alternate embodiment of the RF notch filter 18 (FIG. 1), the RF notch filter 18 (FIG. 1) is a fixed RF notch filter, such that the RF notch frequency RNF is not a selectable notch frequency.

In a first embodiment of the frequency response 22, the RF notch frequency RNF is equal to about 10 megahertz. In a second embodiment of the frequency response 22, the RF notch frequency RNF is equal to about 20 megahertz. In a third embodiment of the frequency response 22, the RF notch frequency RNF is equal to about 30 megahertz. In a fourth embodiment of the frequency response 22, the RF notch frequency RNF is equal to about 40 megahertz. In a fifth embodiment of the frequency response 22, the RF notch frequency RNF is equal to about 50 megahertz.

Figure 4:
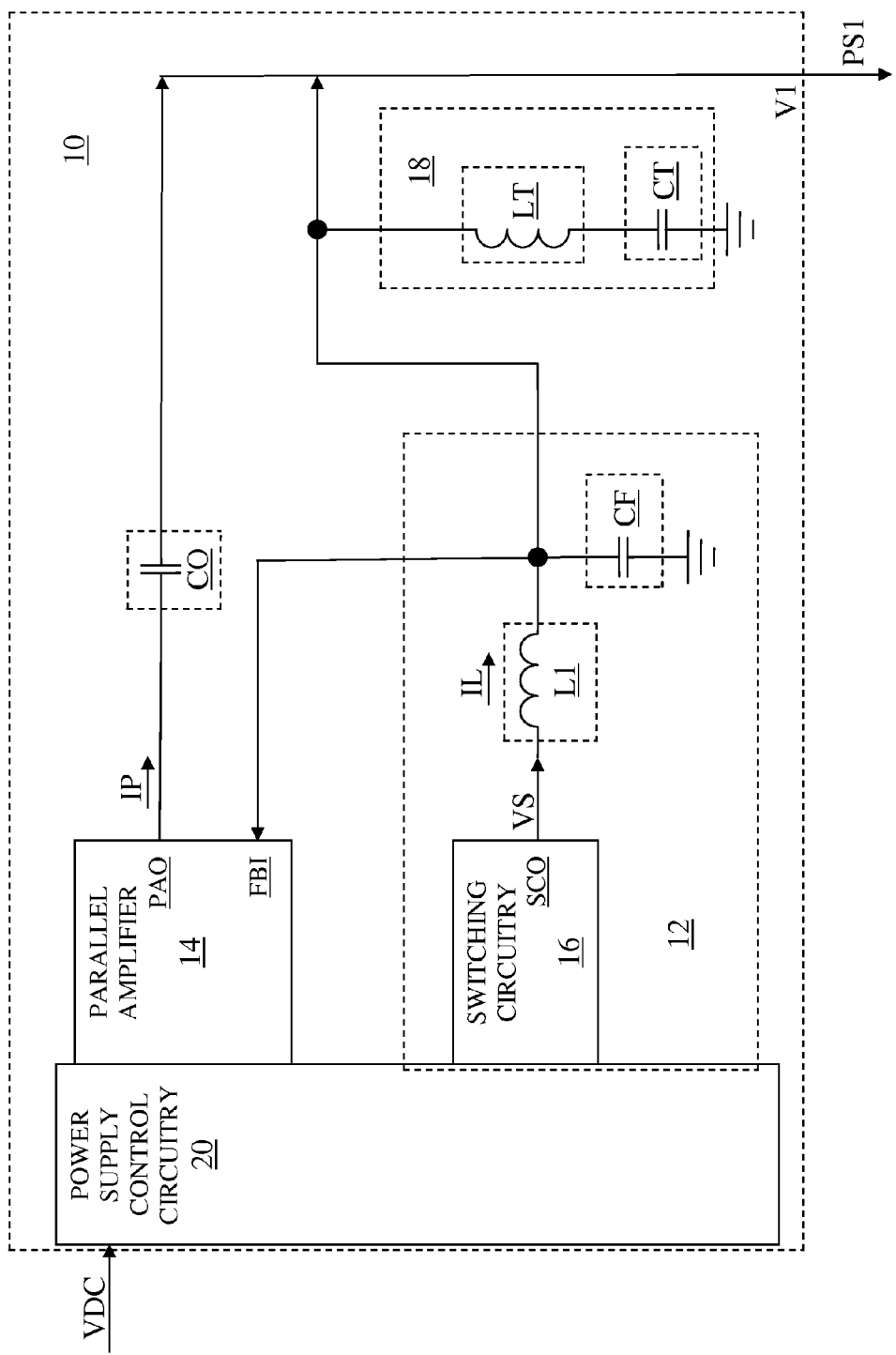
FIG. 4 shows the DC-DC converter according to another embodiment of the DC-DC converter.

FIG. 4 shows the DC-DC converter 10 according to another embodiment of the DC-DC converter 10. The DC-DC converter 10 illustrated in FIG. 4 is similar to the DC-DC converter 10 illustrated in FIG. 2, except the DC-DC converter 10 illustrated in FIG. 4 further includes an offset capacitive element CO coupled between the parallel amplifier output PAO and the feedback input FBI. As such, the switching supply 12 is coupled to the parallel amplifier output PAO via the offset capacitive element CO and the RF notch filter 18 is coupled to the parallel amplifier output PAO via the offset capacitive element CO. Additionally, the RF notch filter 18 includes a notch filter capacitive element CT and a notch filter inductive element LT coupled in series. The notch filter capacitive element CT and the notch filter inductive element LT form a resonant circuit having a resonant frequency. The RF notch frequency RNF (FIG. 3) is based on the resonant frequency. A shape of the frequency response 22 (FIG. 3) near the RF notch frequency RNF (FIG. 3) may be based on a Q factor of the resonant circuit.

The parallel amplifier 14 partially provides the first power supply output signal PS1 via the parallel amplifier output PAO and the offset capacitive element CO based on the voltage setpoint. The offset capacitive element CO allows the first voltage V1 to be higher than a voltage at the parallel amplifier output PAO. As a result, the parallel amplifier 14 may properly regulate the first voltage V1 even if the first voltage V1 is greater than a maximum output voltage from the parallel amplifier 14 at the parallel amplifier output PAO. In the embodiment of the DC-DC converter 10 illustrated in FIG. 4, the filter capacitive element CF is coupled between the parallel amplifier output PAO and the ground through the offset capacitive element CO. In an alternate embodiment of the DC-DC converter 10, the offset capacitive element CO is omitted.

Figure 5:
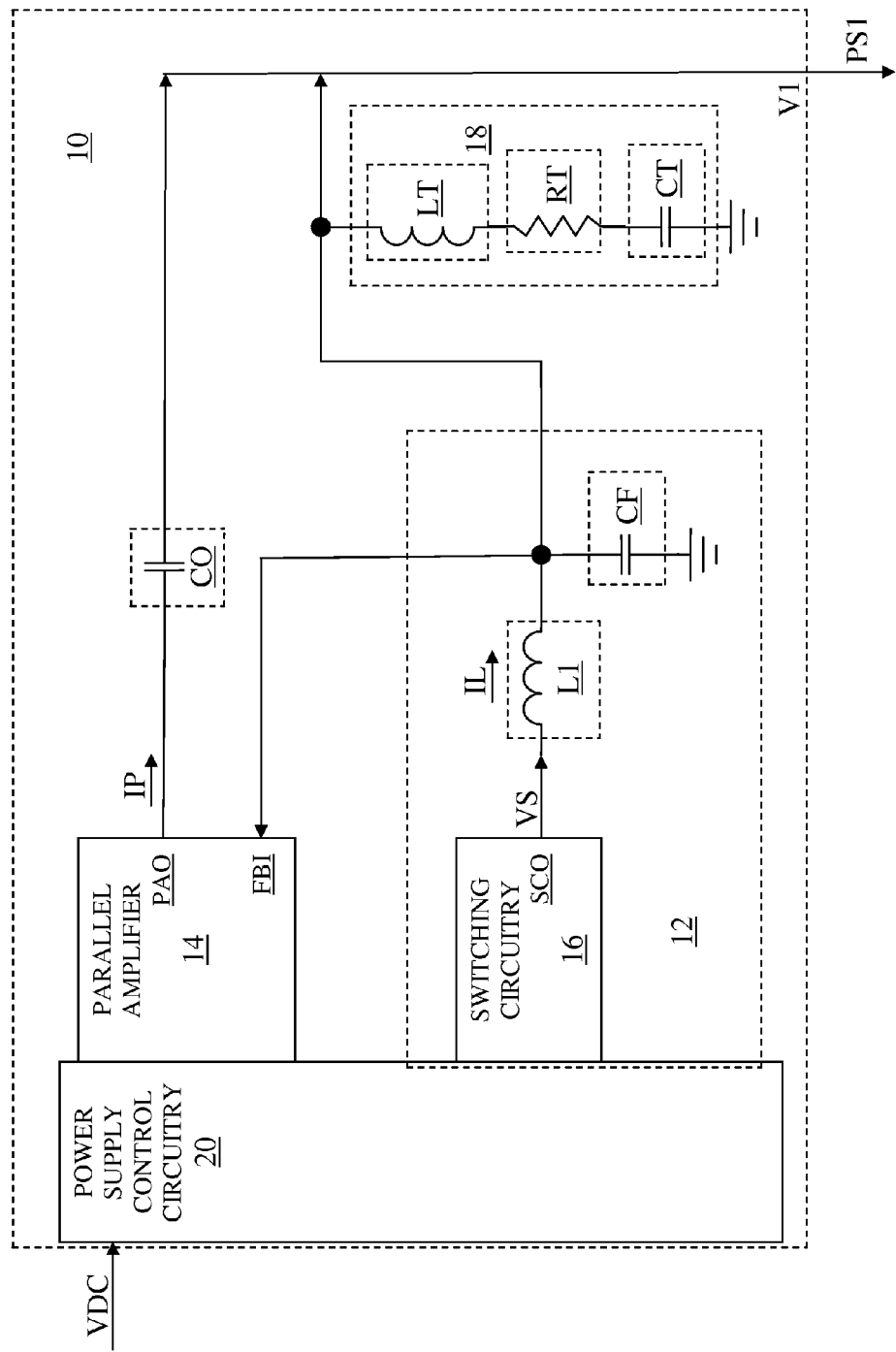
FIG. 5 shows the DC-DC converter according to a further embodiment of the DC-DC converter.

FIG. 5 shows the DC-DC converter 10 according to a further embodiment of the DC-DC converter 10. The DC-DC converter 10 illustrated in FIG. 5 is similar to the DC-DC converter 10 illustrated in FIG. 4, except in the DC-DC converter 10 illustrated in FIG. 5, the RF notch filter 18 includes the notch filter capacitive element CT, the notch filter inductive element LT, and a notch filter resistive element RT coupled in series. The notch filter capacitive element CT, the notch filter inductive element LT, and the notch filter resistive element RT form a resonant circuit having a resonant frequency. The RF notch frequency RNF (FIG. 3) is based on the resonant frequency. A shape of the frequency response 22 (FIG. 3) near the RF notch frequency RNF (FIG. 3) may be based on a Q factor of the resonant circuit.

Figure 6:
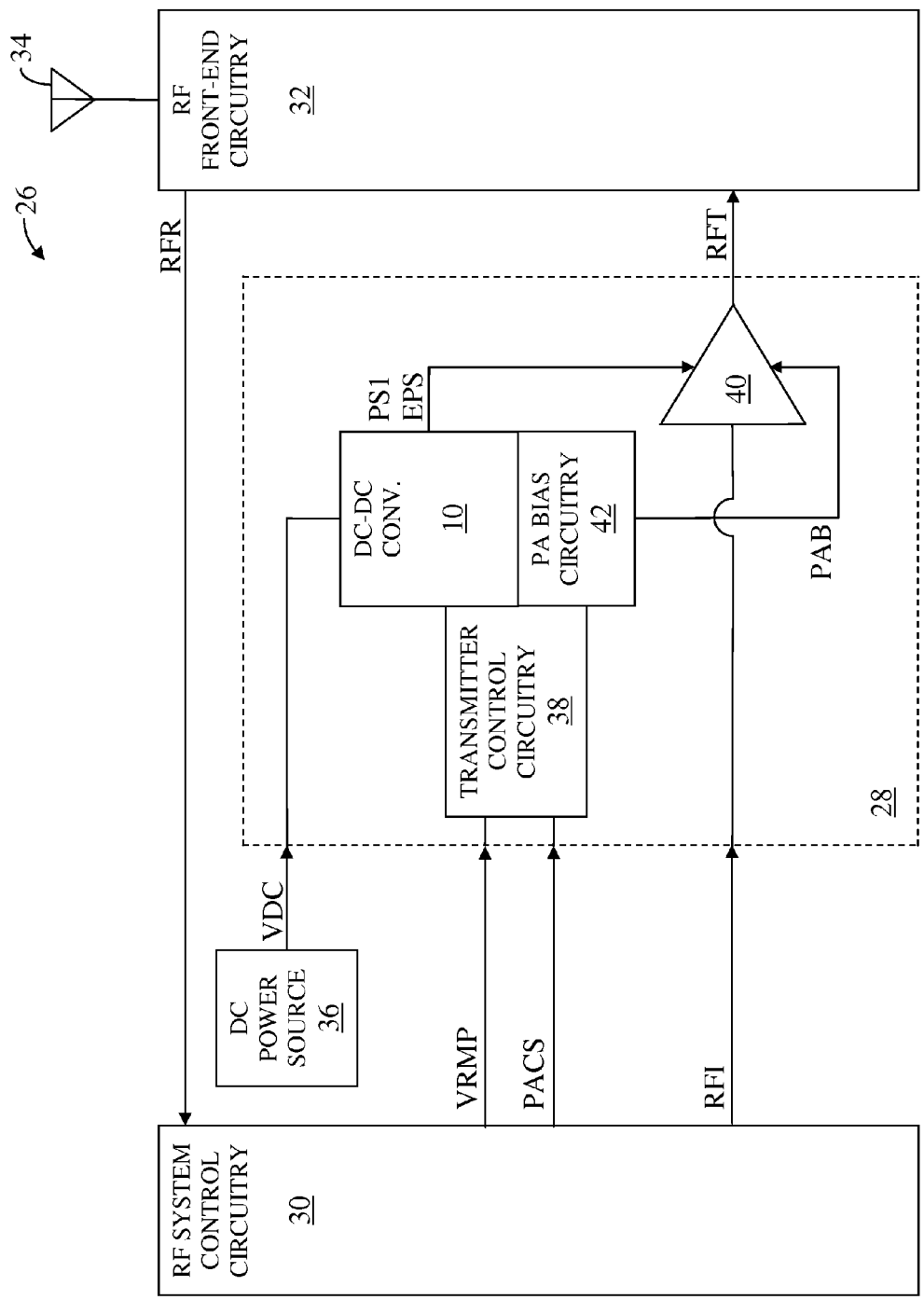
FIG. 6 shows a radio frequency (RF) communications system according to one embodiment of the present disclosure.

FIG. 6 shows a radio frequency (RF) communications system 26 according to one embodiment of the present disclosure. The RF communications system 26 includes RF transmitter circuitry 28, RF system control circuitry 30, RF front-end circuitry 32, an RF antenna 34, and a DC power source 36. The RF transmitter circuitry 28 includes transmitter control circuitry 38, an RF power amplifier (PA) 40, the DC-DC converter 10, and PA bias circuitry 42. The DC-DC converter 10 functions as an envelope tracking power supply. In an alternate embodiment of the RF communications system 26, the DC power source 36 is external to the RF communications system 26.

In one embodiment of the RF communications system 26, the RF front-end circuitry 32 receives via the RF antenna 34, processes, and forwards an RF receive signal RFR to the RF system control circuitry 30. In one embodiment of the RF communications system 26, the RF receive signal RFR has an RF receive frequency. Further, the RF notch frequency RNF (FIG. 3) is about equal to the RF receive frequency, which may reduce noise, ripple, or both in the receive path from the transmit path or other noise sources. The RF system control circuitry 30 provides a power supply control signal VRMP and a transmitter configuration signal PACS to the transmitter control circuitry 38. The RF system control circuitry 30 provides an RF input signal RFI to the RF PA 40. The DC power source 36 provides a DC source signal VDC to the DC-DC converter 10. In one embodiment of the DC power source 36, the DC power source 36 is a battery. In one embodiment of the power supply control signal VRMP, the power supply control signal VRMP is an envelope power supply control signal. Specifically, the DC power source 36 provides the DC source signal VDC to the parallel amplifier 14 (FIG. 1) and to the switching supply 12 (FIG. 1).

The transmitter control circuitry 38 is coupled to the DC-DC converter 10 and to the PA bias circuitry 42. The DC-DC converter 10 provides the first power supply output signal PS1 to the RF PA 40 based on the power supply control signal VRMP. In this regard, the DC-DC converter 10 is an envelope tracking power supply and the first power supply output signal PS1 is a first envelope power supply signal EPS. The DC source signal VDC provides power to the DC-DC converter 10. As such, the first power supply output signal PS1, which is the first envelope power supply signal EPS, is based on the DC source signal VDC. The power supply control signal VRMP is representative of a voltage setpoint of the first envelope power supply signal EPS. The RF PA 40 receives and amplifies the RF input signal RFI to provide an RF transmit signal RFT using the first envelope power supply signal EPS. The first envelope power supply signal EPS provides power for amplification to the RF PA 40.

In one embodiment of the DC-DC converter 10, the first envelope power supply signal EPS is amplitude modulated to at least partially provide envelope tracking. In one embodiment of the RF PA 40, the RF PA 40 operates with approximately constant gain, called isogain, and with gain compression. In a first embodiment of the gain compression, the gain compression is greater than about one decibel. In a second embodiment of the gain compression, the gain compression is greater than about two decibels. In a third embodiment of the gain compression, the gain compression is equal to about two decibels. In a fourth embodiment of the gain compression, the gain compression is equal to about three decibels. In a fifth embodiment of the gain compression, the gain compression is equal to about four decibels. By operating with higher levels of gain compression, efficiency of the RF PA 40 may be increased, which may help compensate for reduced efficiency in the DC-DC converter 10.

In a first embodiment of the first envelope power supply signal EPS, a bandwidth of the first envelope power supply signal EPS is greater than or equal to about 10 megahertz. In a second embodiment of the first envelope power supply signal EPS, a bandwidth of the first envelope power supply signal EPS is less than or equal to about 10 megahertz. In a third embodiment of the first envelope power supply signal EPS, a bandwidth of the first envelope power supply signal EPS is greater than or equal to about 20 megahertz. In a fourth embodiment of the first envelope power supply signal EPS, a bandwidth of the first envelope power supply signal EPS is less than or equal to about 20 megahertz.

The RF front-end circuitry 32 receives, processes, and transmits the RF transmit signal RFT via the RF antenna 34. In one embodiment of the RF transmitter circuitry 28, the transmitter control circuitry 38 configures the RF transmitter circuitry 28 based on the transmitter configuration signal PACS. In one embodiment of the RF communications system 26, the RF communications system 26 operates in a full duplex environment, such that the RF transmit signal RFT and the RF receive signal RFR may be active simultaneously. The RF transmit signal RFT has an RF transmit frequency and the RF receive signal RFR has the RF receive frequency. A difference between the RF transmit frequency and the RF receive frequency is about equal to an RF duplex frequency. In one embodiment of the RF communications system 26, the RF notch frequency RNF (FIG. 3) is about equal to the RF duplex frequency, which may reduce noise in the receive path from the transmit path.

In one embodiment of the RF notch filter 18 (FIG. 1), the RF notch filter 18 (FIG. 1) is a programmable RF notch filter, such that the RF notch frequency RNF is a selectable notch frequency. In one embodiment of the programmable RF notch filter, the selectable notch frequency is based on the RF duplex frequency. In one embodiment of the programmable RF notch filter, the selectable notch frequency is about equal to the RF duplex frequency. In one embodiment of the RF communications system 26, the transmitter control circuitry 38 selects the selectable notch frequency based on the RF duplex frequency. In one embodiment of the RF communications system 26, the RF system control circuitry 30 provides notch frequency information to the transmitter control circuitry 38 via the transmitter configuration signal PACS. The notch frequency information is based on the RF duplex frequency. Then, the transmitter control circuitry 38 selects the selectable notch frequency based on the notch frequency information. As such, selection of the selectable notch frequency is based on the notch frequency information.

In a first embodiment of the RF duplex frequency, the RF duplex frequency is greater than or equal to about 10 megahertz. In a second embodiment of the RF duplex frequency, the RF duplex frequency is greater than or equal to about 20 megahertz. In a third embodiment of the RF duplex frequency, the RF duplex frequency is greater than or equal to about 30 megahertz. In a fourth embodiment of the RF duplex frequency, the RF duplex frequency is greater than or equal to about 40 megahertz. In a fifth embodiment of the RF duplex frequency, the RF duplex frequency is greater than or equal to about 50 megahertz.

The PA bias circuitry 42 provides a PA bias signal PAB to the RF PA 40. In this regard, the PA bias circuitry 42 biases the RF PA 40 via the PA bias signal PAB. In one embodiment of the PA bias circuitry 42, the PA bias circuitry 42 biases the RF PA 40 based on the transmitter configuration signal PACS. In one embodiment of the RF front-end circuitry 32, the RF front-end circuitry 32 includes at least one RF switch, at least one RF amplifier, at least one RF filter, at least one RF duplexer, at least one RF diplexer, the like, or any combination thereof. In one embodiment of the RF system control circuitry 30, the RF system control circuitry 30 is RF transceiver circuitry, which may include an RF transceiver IC, baseband controller circuitry, the like, or any combination thereof. In one embodiment of the RF transmitter circuitry 28, the DC-DC converter 10 provides the first envelope power supply signal EPS, which has switching ripple. In one embodiment of the RF transmitter circuitry 28, the first envelope power supply signal EPS provides power for amplification and at least partially envelope tracks the RF transmit signal RFT.

Figure 7:
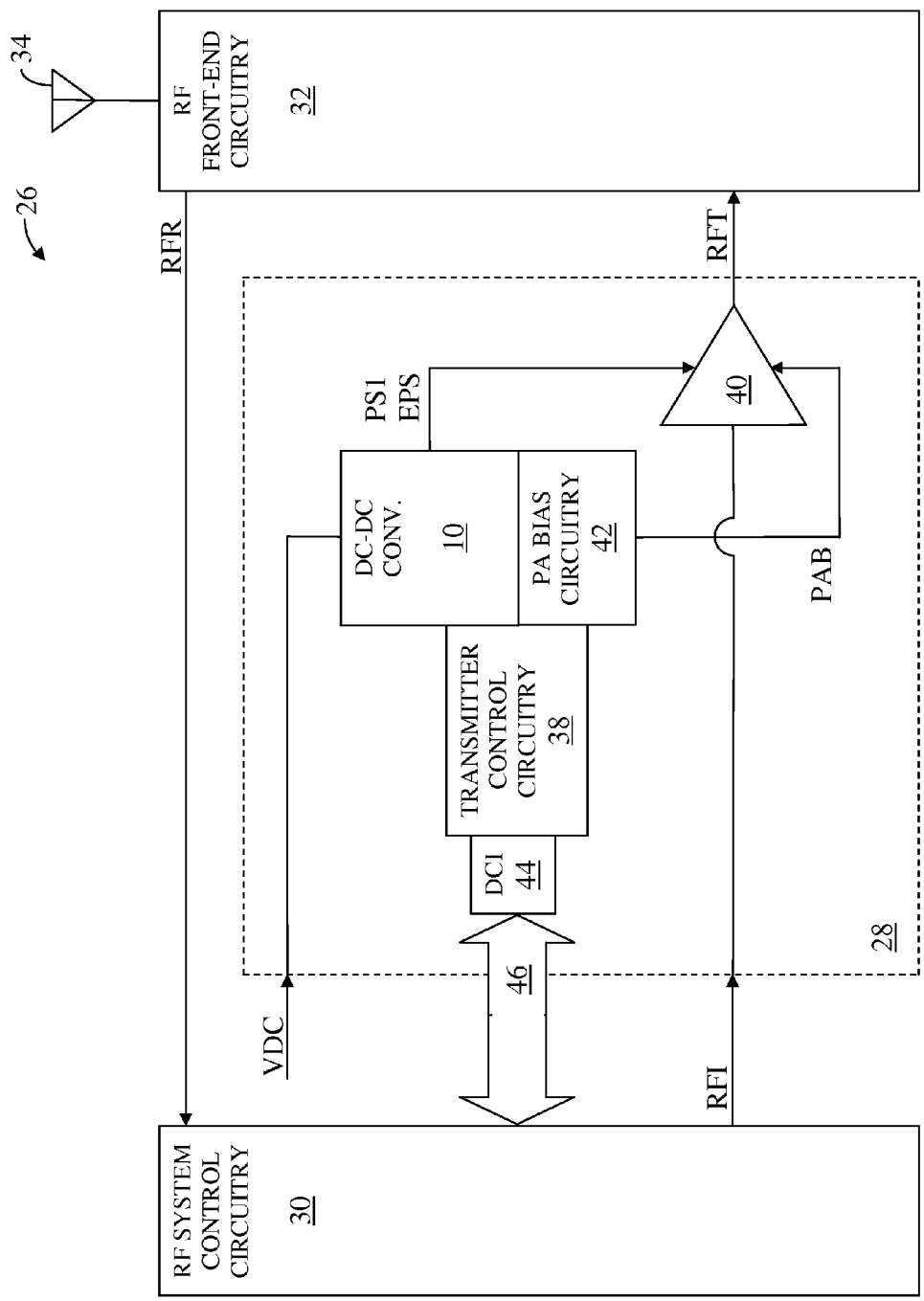
FIG. 7 shows the RF communications system according to an alternate embodiment of the RF communications system.

FIG. 7 shows the RF communications system 26 according to an alternate embodiment of the RF communications system 26. The RF communications system 26 illustrated in FIG. 7 is similar to the RF communications system 26 illustrated in FIG. 6, except in the RF communications system 26 illustrated in FIG. 7, the RF transmitter circuitry 28 further includes a digital communications interface 44, which is coupled between the transmitter control circuitry 38 and a digital communications bus 46. The digital communications bus 46 is also coupled to the RF system control circuitry 30. As such, the RF system control circuitry 30 provides the power supply control signal VRMP (FIG. 6) and the transmitter configuration signal PACS (FIG. 6) to the transmitter control circuitry 38 via the digital communications bus 46 and the digital communications interface 44.

Figure 8:
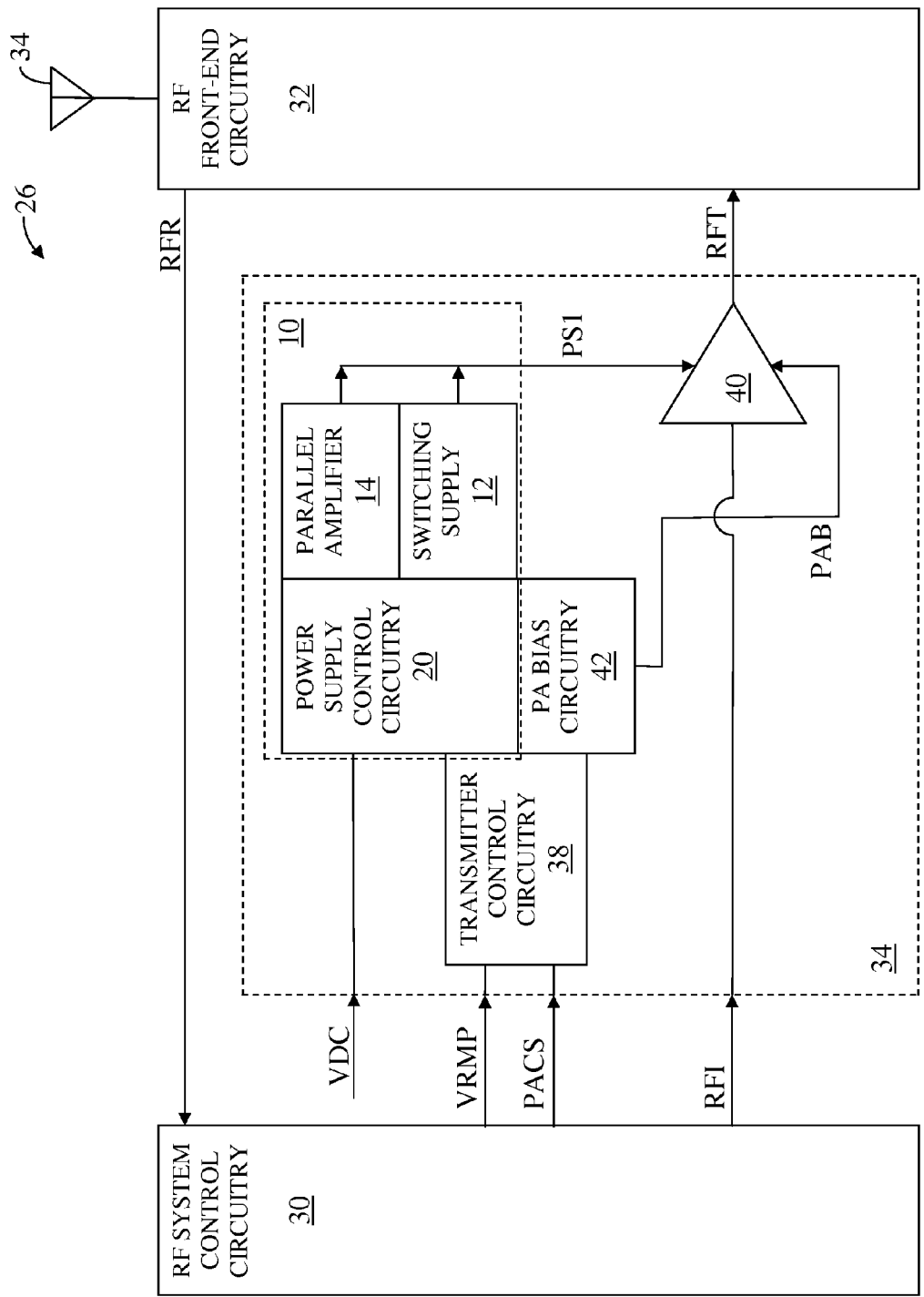
FIG. 8 shows the RF communications system according to an additional embodiment of the RF communications system.

FIG. 8 shows details of the DC-DC converter 10 illustrated in FIG. 6 according to one embodiment of the DC-DC converter 10. The DC-DC converter 10 includes the power supply control circuitry 20, the parallel amplifier 14, and the switching supply 12. The power supply control circuitry 20 controls the parallel amplifier 14 and the switching supply 12. The parallel amplifier 14 and the switching supply 12 provide the first power supply output signal PS1, such that the parallel amplifier 14 partially provides the first power supply output signal PS1 and the switching supply 12 partially provides the first power supply output signal PS1.

Figure 9:
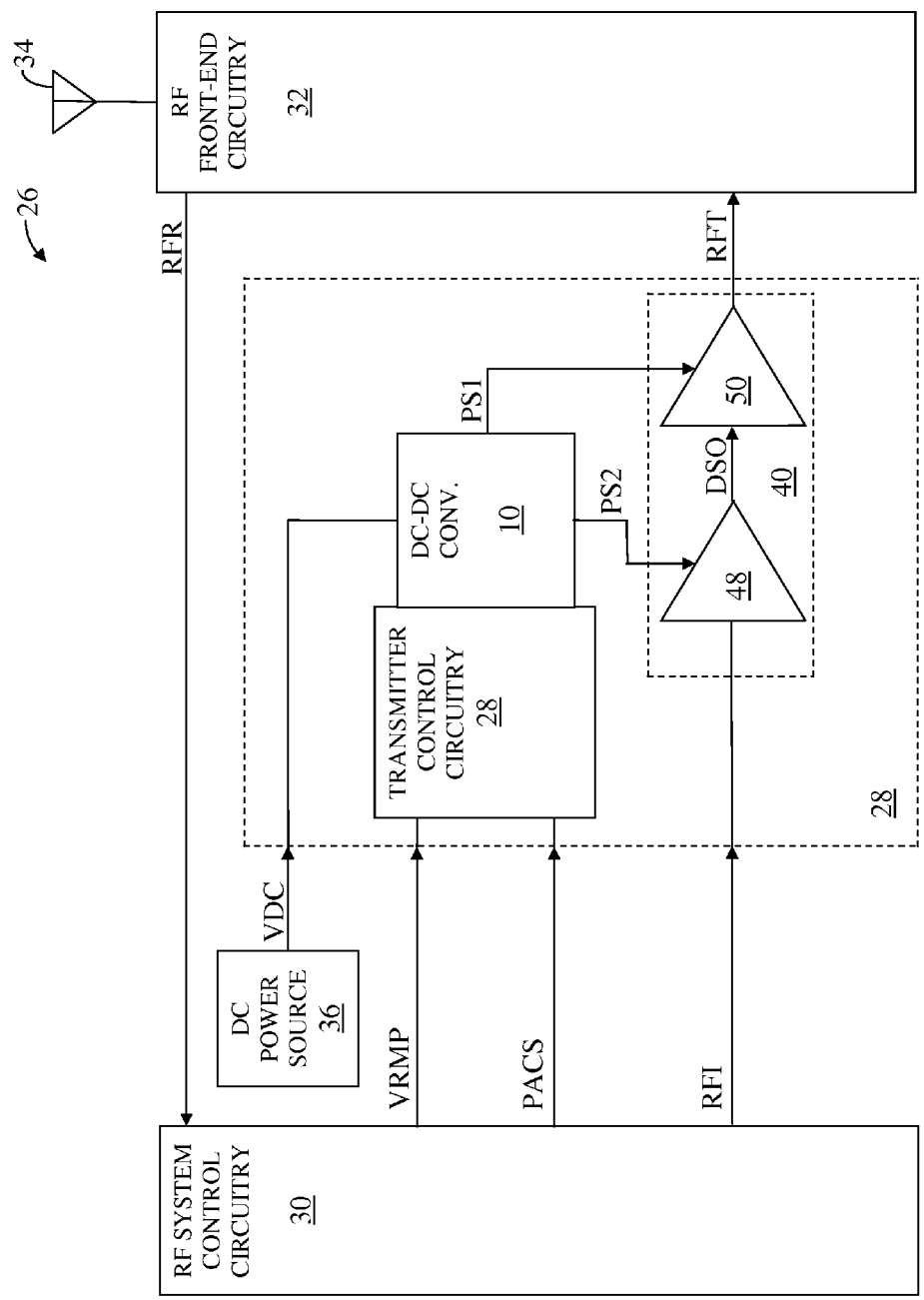
FIG. 9 shows the RF communications system according to another embodiment of the RF communications system.

FIG. 9 shows the RF communications system 26 according to another embodiment of the RF communications system 26. The RF communications system 26 illustrated in FIG. 9 is similar to the RF communications system 26 illustrated in FIG. 6, except in the RF communications system 26 illustrated in FIG. 9, the PA bias circuitry 42 (FIG. 6) is omitted and the RF PA 40 includes a driver stage 48 and a final stage 50, which is coupled to the driver stage 48. The DC-DC converter 10 provides the second power supply output signal PS2, which is a second envelope power supply signal, to the driver stage 48 based on the power supply control signal VRMP. Further, the DC-DC converter 10 provides the first power supply output signal PS1, which is the first envelope power supply signal, to the final stage 50 based on the power supply control signal VRMP. The driver stage 48 receives and amplifies the RF input signal RFI to provide a driver stage output signal DSO using the second envelope power supply signal, which provides power for amplification. Similarly, the final stage 50 receives and amplifies the driver stage output signal DSO to provide the RF transmit signal RFT using the first envelope power supply signal, which provides power for amplification.

Figure 10:
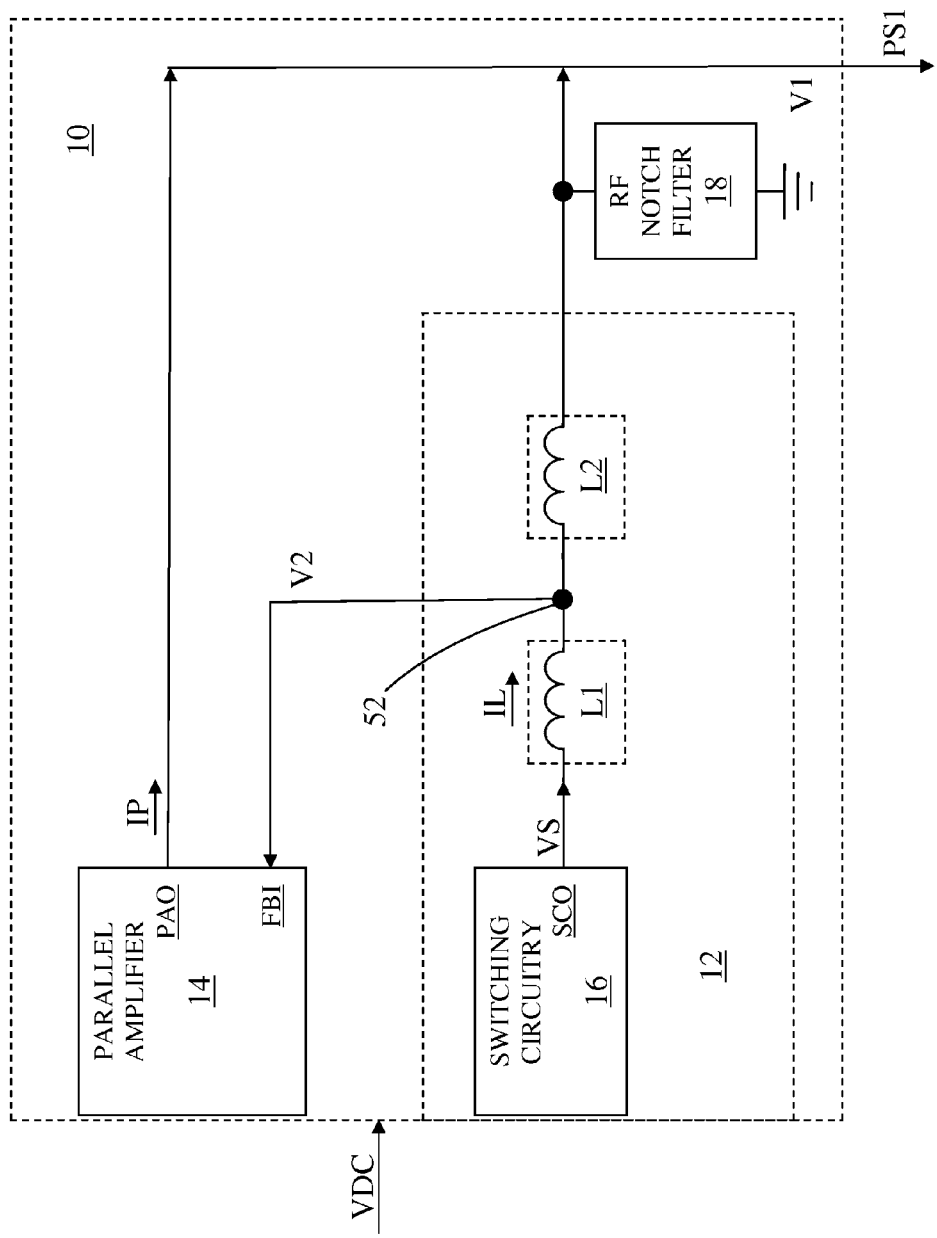
FIG. 10 shows the DC-DC converter according to one embodiment of the DC-DC converter.

FIG. 10 shows the DC-DC converter 10 according to one embodiment of the DC-DC converter 10. The DC-DC converter 10 illustrated in FIG. 10 is similar to the DC-DC converter 10 illustrated in FIG. 1, except in the DC-DC converter 10 illustrated in FIG. 10, the switching supply 12 further includes a second inductive element L2. The second inductive element L2 is coupled between the feedback input FBI and the parallel amplifier output PAO. The switching supply 12 partially provides the first power supply output signal PS1 via the first inductive element L1 and the second inductive element L2. Specifically, the switching supply 12 partially provides the first power supply output signal PS1 via a series combination of the first inductive element L1 and the second inductive element L2.

In one embodiment of the switching supply 12, a connection node 52 is provided where the first inductive element L1 and the second inductive element L2 are connected to one another. The connection node 52 provides a second voltage V2 to the parallel amplifier 14 via the feedback input FBI. Further, in one embodiment of the parallel amplifier 14, the parallel amplifier 14 has a limited open loop gain at high frequencies that are above a frequency threshold. At such frequencies, a group delay in the parallel amplifier 14 may normally limit the ability of the parallel amplifier 14 to accurately regulate the first voltage V1 of the first power supply output signal PS1. However, by feeding back the second voltage V2 to the feedback input FBI instead of the first voltage V1, a phase-shift that is developed across the second inductive element L2 at least partially compensates for the limited open loop gain of the parallel amplifier 14 at frequencies that are above the frequency threshold, thereby improving the ability of the parallel amplifier 14 to accurately regulate the first voltage V1. In this regard, in one embodiment of the DC-DC converter 10, the parallel amplifier 14 partially provides the first power supply output signal PS1 via the parallel amplifier output PAO based on the voltage setpoint and feeding back a voltage to the feedback input FBI from the connection node 52 between the first inductive element L1 and the second inductive element L2.

Figure 11:
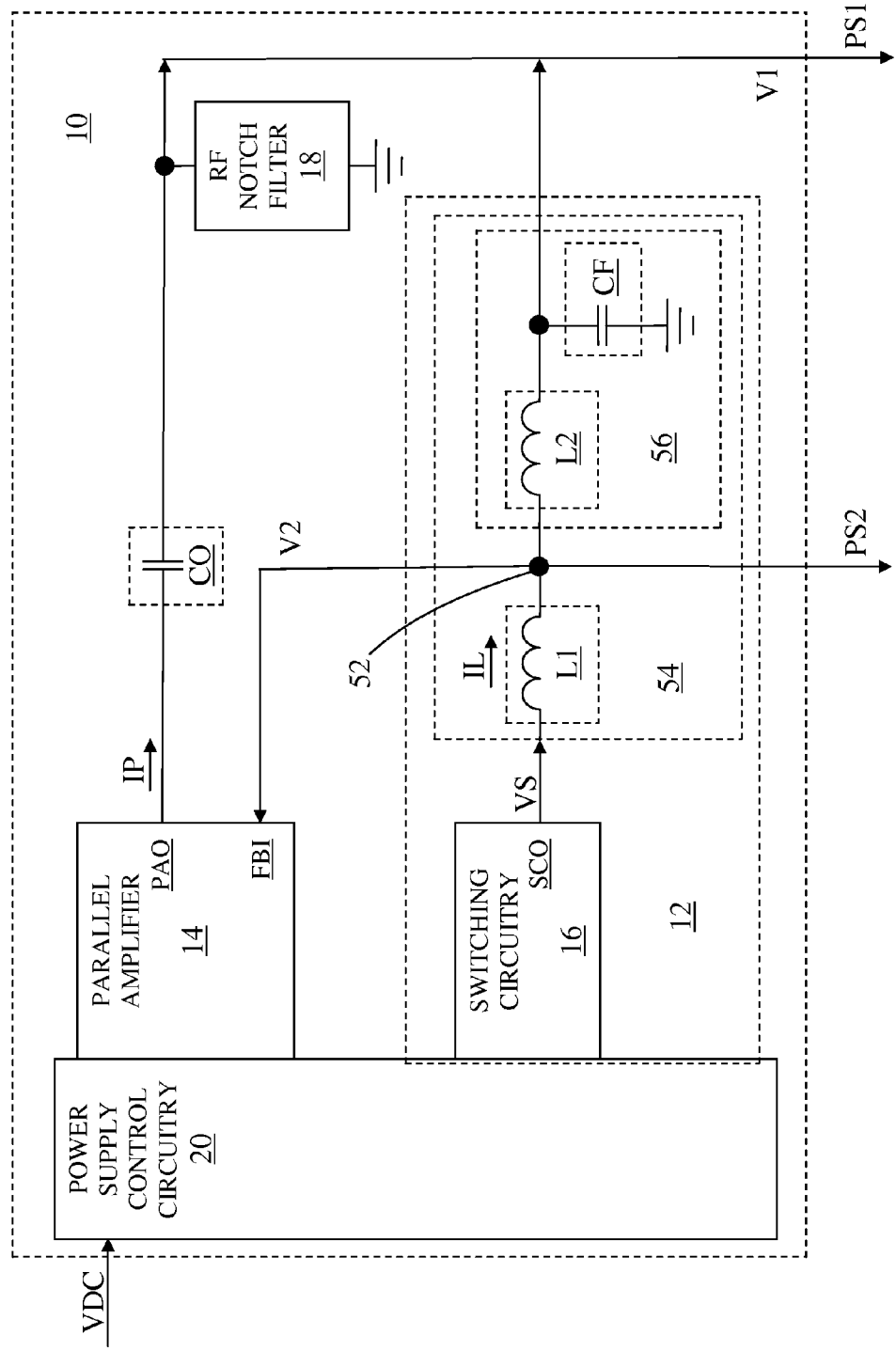
FIG. 11 shows the DC-DC converter according to an alternate embodiment of the DC-DC converter.

FIG. 11 shows the DC-DC converter 10 according to an alternate embodiment of the DC-DC converter 10. The DC-DC converter 10 illustrated in FIG. 11 is similar to the DC-DC converter 10 illustrated in FIG. 10, except the DC-DC converter 10 illustrated in FIG. 11 further includes the offset capacitive element CO and the switching supply 12 further includes the filter capacitive element CF. The offset capacitive element CO is coupled between the parallel amplifier output PAO and the second inductive element L2. In one embodiment of the DC-DC converter 10, the parallel amplifier 14 partially provides the first power supply output signal PS1 via the parallel amplifier output PAO and the offset capacitive element CO based on the voltage setpoint. The first inductive element L1 and the second inductive element L2 provide a second power supply output signal PS2 via the connection node 52.

The first inductive element L1, the second inductive element L2, and the filter capacitive element CF form a first low-pass filter 54 having a first cutoff frequency. The second inductive element L2 and the filter capacitive element CF form a second low-pass filter 56 having a second cutoff frequency. The second cutoff frequency may be significantly higher than the first cutoff frequency. As such, the first low-pass filter 54 may be used primarily to filter the switching output voltage VS, which is typically a square wave. However, the second low-pass filter 56 may be used to target specific high frequencies, such as certain harmonics of the switching output voltage VS.

In a first embodiment of the first low-pass filter 54 and the second low-pass filter 56, the second cutoff frequency is at least 10 times greater than the first cutoff frequency. In a second embodiment of the first low-pass filter 54 and the second low-pass filter 56, the second cutoff frequency is at least 100 times greater than the first cutoff frequency. In a third embodiment of the first low-pass filter 54 and the second low-pass filter 56, the second cutoff frequency is at least 500 times greater than the first cutoff frequency. In a fourth embodiment of the first low-pass filter 54 and the second low-pass filter 56, the second cutoff frequency is at least 1000 times greater than the first cutoff frequency. In a fifth embodiment of the first low-pass filter 54 and the second low-pass filter 56, the second cutoff frequency is less than 1000 times greater than the first cutoff frequency. In a sixth embodiment of the first low-pass filter 54 and the second low-pass filter 56, the second cutoff frequency is less than 5000 times greater than the first cutoff frequency.

The first inductive element L1 has a first inductance and the second inductive element L2 has a second inductance. In a first embodiment of the first inductive element L1 and the second inductive element L2, a magnitude of the first inductance is at least 10 times greater than a magnitude of the second inductance. In a second embodiment of the first inductive element L1 and the second inductive element L2, a magnitude of the first inductance is at least 100 times greater than a magnitude of the second inductance. In a third embodiment of the first inductive element L1 and the second inductive element L2, a magnitude of the first inductance is at least 500 times greater than a magnitude of the second inductance. In a fourth embodiment of the first inductive element L1 and the second inductive element L2, a magnitude of the first inductance is at least 1000 times greater than a magnitude of the second inductance. In a fifth embodiment of the first inductive element L1 and the second inductive element L2, a magnitude of the first inductance is less than 1000 times greater than a magnitude of the second inductance. In a sixth embodiment of the first inductive element L1 and the second inductive element L2, a magnitude of the first inductance is less than 5000 times greater than a magnitude of the second inductance.

An analysis of improved ripple cancellation performance of the DC-DC converter 10 illustrated in FIG. 11 is presented. In general, the first power supply output signal PS1 is fed to a load (not shown) having a load resistance RL, such as the RF PA 40 (FIG. 6). The switching output voltage VS has a DC component called a DC voltage VD and a ripple component called an AC voltage VA given by EQ. 1, as shown below.

$$VS=VD+VA. \quad\quad\quad EQ.\ 1$$

Further, the inductor current IL has a DC current ID and an AC current IA given by EQ. 2, as shown below.

$$IL=ID+IA. \quad\quad\quad EQ.\ 2$$

The DC-DC converter 10 regulates the DC voltage VD to be about equal to the voltage setpoint. The first inductive element L1 and the second inductive element L2 appear approximately as short circuits to the DC component. Further, the filter capacitive element CF appears approximately as an open circuit to the DC component. Therefore, the DC voltage VD is approximately applied to the load resistance RL, as intended. As a result, the DC current ID is based on the DC voltage VD and the load resistance RL, as shown in EQ. 3 below.

$$ID=VD/RL. \quad\quad\quad EQ.\ 3$$

Most of the ripple components of the switching output voltage VS is filtered out from the first voltage V1 by the first low-pass filter 54 and the second low-pass filter 56. As a result, most of the AC voltage VA is across the series combination of the first inductive element L1 and the second inductive element L2. The first inductive element L1 has a first inductance I1 and the second inductive element L2 has a second inductance I2. Therefore, the AC current IA is based on the AC voltage VA, the first inductance I1 and the second inductance I2, where s=j2πf, j=√−1, and f=frequency, as shown in EQ. 4 below.

$$IA=VA/[s(I1+I2)]. \quad\quad\quad EQ.\ 4$$

Much of what remains of the ripple component is cancelled out from the first voltage V1 by the parallel amplifier 14. However, to the extent that the parallel amplifier 14 cannot completely cancel out the remains of the ripple component, the first voltage V1 has a first residual ripple voltage VR1 and the second voltage V2 has a second residual ripple voltage VR2. Two approaches to ripple cancellation will be compared against one another. In the first approach, the DC-DC converter 10 is the DC-DC converter 10 illustrated in FIG. 10, such that the second voltage V2 is fed to the feedback input FBI, as shown. In this regard, the second residual ripple voltage VR2 drives the parallel amplifier 14 to provide a ripple cancellation current, which is the parallel amplifier output current IP. In the second approach, the DC-DC converter 10 is similar to the DC-DC converter 10 illustrated in FIG. 10, except the first voltage V1 is fed to the feedback input FBI instead of the second voltage V2, such that the first residual ripple voltage VR1 drives the parallel amplifier 14 to provide the ripple cancellation current, which is the parallel amplifier output current IP.

In the following analysis, the parallel amplifier 14 has a DC open loop gain GO and an open loop bandwidth factor T. As a result, the parallel amplifier 14 has a gain G, as shown in EQ. 5 below.

$$G=GO/(1+sT). \quad\quad\quad EQ.\ 5$$

As a result, at frequencies significantly below an open loop bandwidth of the parallel amplifier 14, the open loop bandwidth factor T is small compared to one, such that the gain G approaches the DC open loop gain GO. Conversely, at frequencies significantly above the open loop bandwidth of the parallel amplifier 14, the open loop bandwidth factor T is large compared to one, such that the gain G approaches GO/sT.

In the first approach, described above wherein the second residual ripple voltage VR2 drives the parallel amplifier 14 and at frequencies significantly above the open loop bandwidth of the parallel amplifier 14, the parallel amplifier output current IP is based on the second residual ripple voltage VR2, as shown in EQ. 6 below.

$$IP=G*VR2 \approx (GO*VR2)/sT. \quad\quad\quad EQ.\ 6$$

In the second approach described above, when the first residual ripple voltage VR1 drives the parallel amplifier 14 and at frequencies significantly above the open loop bandwidth of the parallel amplifier 14, the parallel amplifier output current IP is based on the first residual ripple voltage VR1, as shown in EQ. 7 below.

$$IP=G*VR1 \approx (GO*VR1)/sT. \quad\quad\quad EQ.\ 7$$

However, a difference between the first residual ripple voltage VR1 and the second residual ripple voltage VR2 is based on the AC current IA and the second inductance I2, as shown in EQ. 8 and EQ. 9 below.

$$(VR2-VR1)=(s)(IA)(I2), \quad\quad\quad EQ.\ 8$$

or $$VR2=(s)(IA)(I2)+VR1. \quad\quad\quad EQ.\ 9$$

Substituting EQ. 9 into EQ. 6 provides EQ. 10 and EQ. 11, as shown below.

$$IP \approx (GO)(VR1)/sT+(GO)(s)(IA)(I2)/sT, \quad\quad\quad EQ.\ 10$$

or $$IP \approx (GO)(VR1)/sT+(GO)(IA)(I2)/T. \quad\quad\quad EQ.\ 11$$

EQ. 11 is representative of the first approach and EQ. 7 is representative of the second approach. As a reminder, in the first approach, the second residual ripple voltage VR2 drives the parallel amplifier 14 and in the second approach, the first residual ripple voltage VR1 drives the parallel amplifier 14. In both equations, a smaller first residual ripple voltage VR1 represents better ripple cancellation performance. For comparison purposes, both approaches are assumed to provide the same magnitude of parallel amplifier output current IP. However, in the second approach, the parallel amplifier output current IP is phase-shifted from the first residual ripple voltage VR1 by about 90 degrees. As such, the parallel amplifier output current IP is phase-shifted from the ripple current it is trying to cancel by about 90 degrees, thereby degrading ripple cancellation performance. However, in the first approach, according to EQ. 11, the parallel amplifier output current IP has two terms, namely the (GO)(VR1)/sT term and the (GO)(IA)(I2)/T term. The (GO)(VR1)/sT term has the same phase-alignment shortcoming as in the second approach. But the (GO)(IA)(I2)/T term phase-aligns the parallel amplifier output current IP with the ripple current it is trying to cancel. Overall, the phase-alignment in the first approach is improved over the second approach. Additionally, to the extent that the (GO)(VR1)/sT term is smaller than the (GO)(IA)(I2)/T term, the first residual ripple voltage VR1 is reduced, thereby improving ripple cancellation. In this regard, if the (GO)(IA)(I2)/T term is equal to the (GO)(VR1)/sT term in EQ. 7, then in the (GO)(VR1)/sT term in EQ. 11, the first residual ripple voltage VR1 is equal to about zero, such that the first approach is greatly improved over the second approach.

Figure 12:
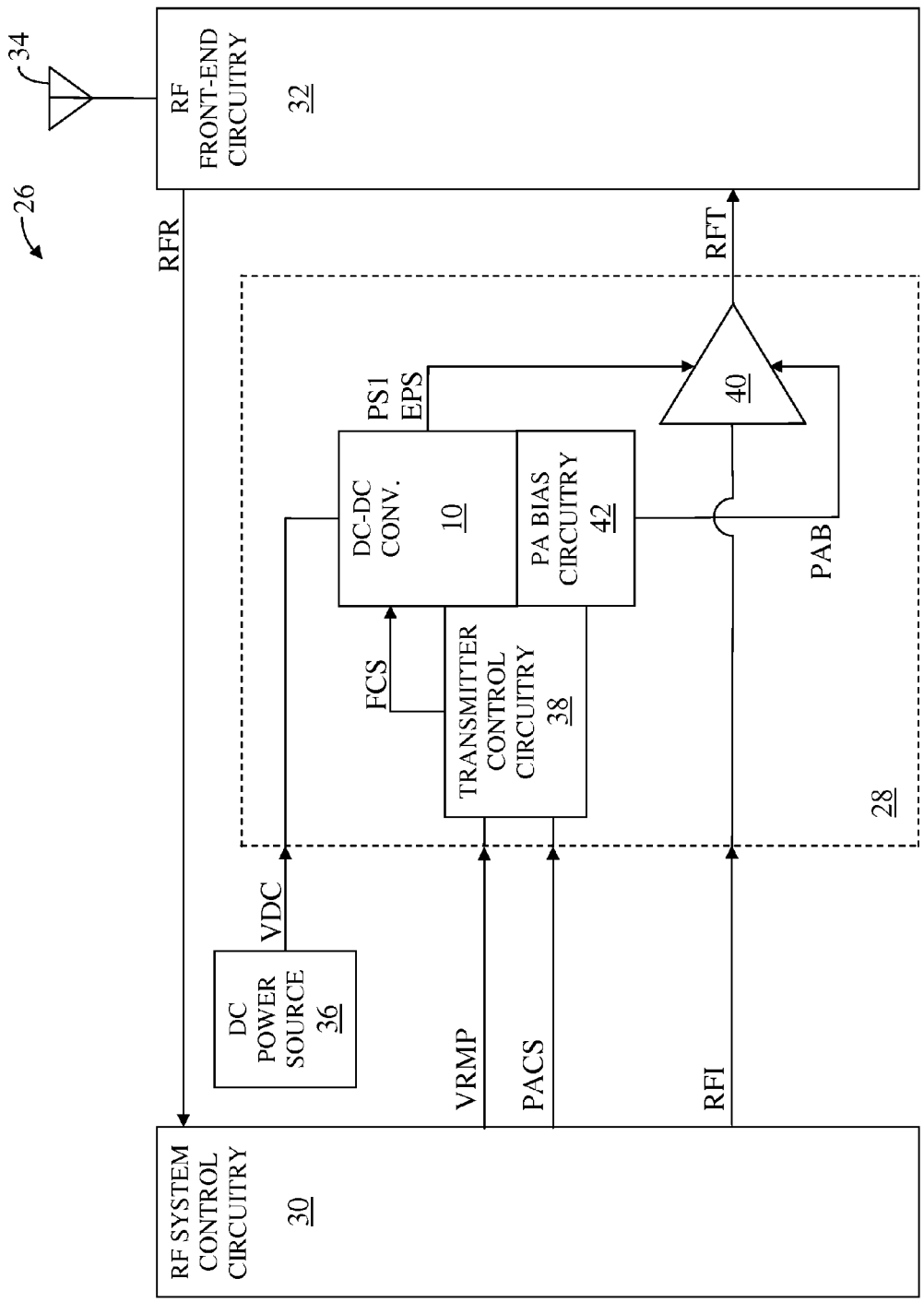
FIG. 12 shows the RF communications system according to one embodiment of the RF communications system.

FIG. 12 shows the RF communications system 26 according to one embodiment of the RF communications system 26. The RF communications system 26 illustrated in FIG. 12 is similar to the RF communications system 26 illustrated in FIG. 6, except in the RF communications system 26 illustrated in FIG. 12 the transmitter control circuitry 38 provides a filter control signal FCS to the DC-DC converter 10. In one embodiment of the RF communications system 26, the transmitter control circuitry 38 selects the selectable notch frequency based on the RF duplex frequency. As such, the filter control signal FCS is indicative of the selection of the selectable notch frequency.

Figure 13:
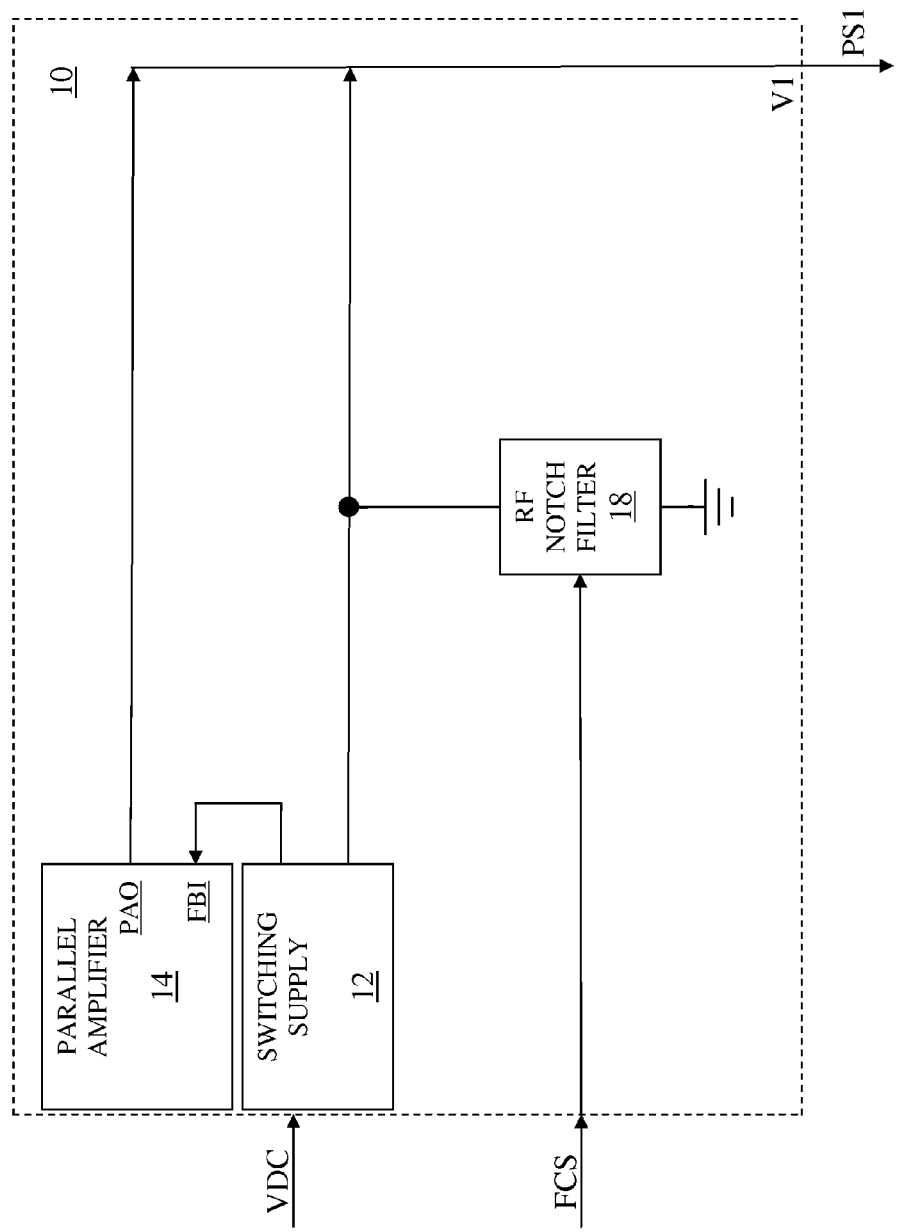
FIG. 13 shows details of the DC-DC converter illustrated in FIG. 12 according to one embodiment of the DC-DC converter.

FIG. 13 shows details of the DC-DC converter 10 illustrated in FIG. 12 according to one embodiment of the DC-DC converter 10. The DC-DC converter 10 illustrated in FIG. 13 is similar to the DC-DC converter 10 illustrated in FIG. 1, except in the DC-DC converter 10 illustrated in FIG. 13, details of the switching supply 12 are not shown and the RF notch filter 18 receives the filter control signal FCS.

Figure 14:
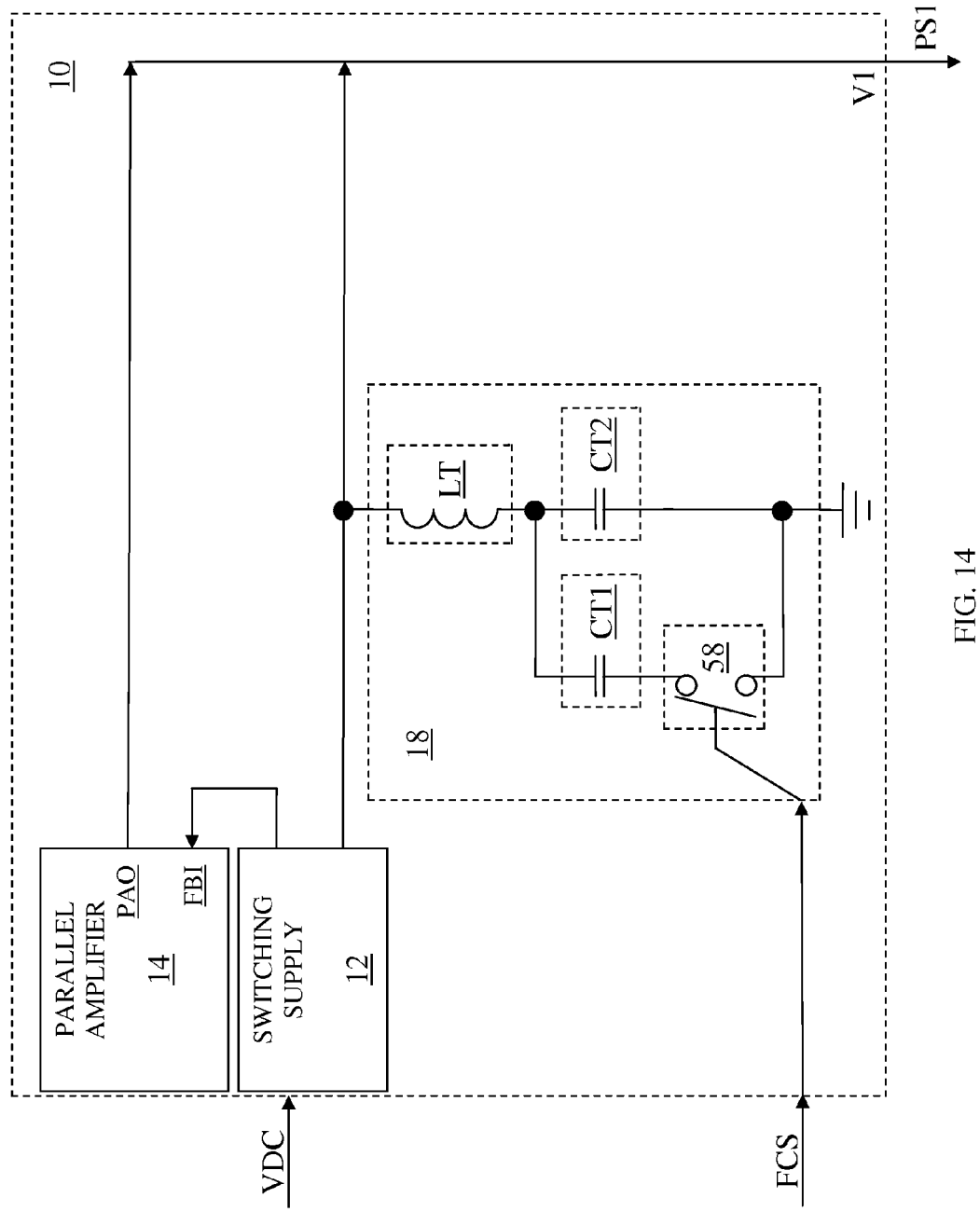
FIG. 14 shows details of an RF notch filter used in the DC-DC converter illustrated in FIG. 13 according to one embodiment of the RF notch filter.

FIG. 14 shows details of the RF notch filter 18 used in the DC-DC converter 10 illustrated in FIG. 13 according to one embodiment of the RF notch filter 18. The RF notch filter 18 includes a notch filter inductive element LT, a first notch filter capacitive element CT1, a second notch filter capacitive element CT2, and a first switching element 58. The notch filter inductive element LT and the second notch filter capacitive element CT2 are coupled in series between the parallel amplifier output PAO and the ground. The first notch filter capacitive element CT1 and the first switching element 58 are coupled in series to form a series coupling, which is coupled across the second notch filter capacitive element CT2.

A control input to the first switching element 58 receives the filter control signal FCS. As such, the first switching element 58 is in one of an ON state and an OFF state based on the filter control signal FCS. Therefore, the selectable notch frequency is one of a first frequency and a second frequency. When the first switching element 58 is in the ON state, the selectable notch frequency is based on a combination of the notch filter inductive element LT in series with a parallel combination of the first notch filter capacitive element CT1 and the second notch filter capacitive element CT2. As such, when the first switching element 58 is in the ON state, the selectable notch frequency is the first frequency. When the first switching element 58 is in the OFF state, the selectable notch frequency is based on a series combination of the notch filter inductive element LT and the second notch filter capacitive element CT2. As such, when the first switching element 58 is in the OFF state, the selectable notch frequency is the second frequency.

In one embodiment of the RF notch filter 18, the first frequency is equal to about 30 megahertz and the second frequency is equal to about 45 megahertz. The filter control signal FCS illustrated in FIG. 14 is a single-bit signal, which minimizes control signal complexity. Further, in one embodiment of the RF notch filter 18, the notch filter inductive element LT and the second notch filter capacitive element CT2 are coupled directly in series between the parallel amplifier output PAO and the ground, which maximizes efficiency.

Figure 15:
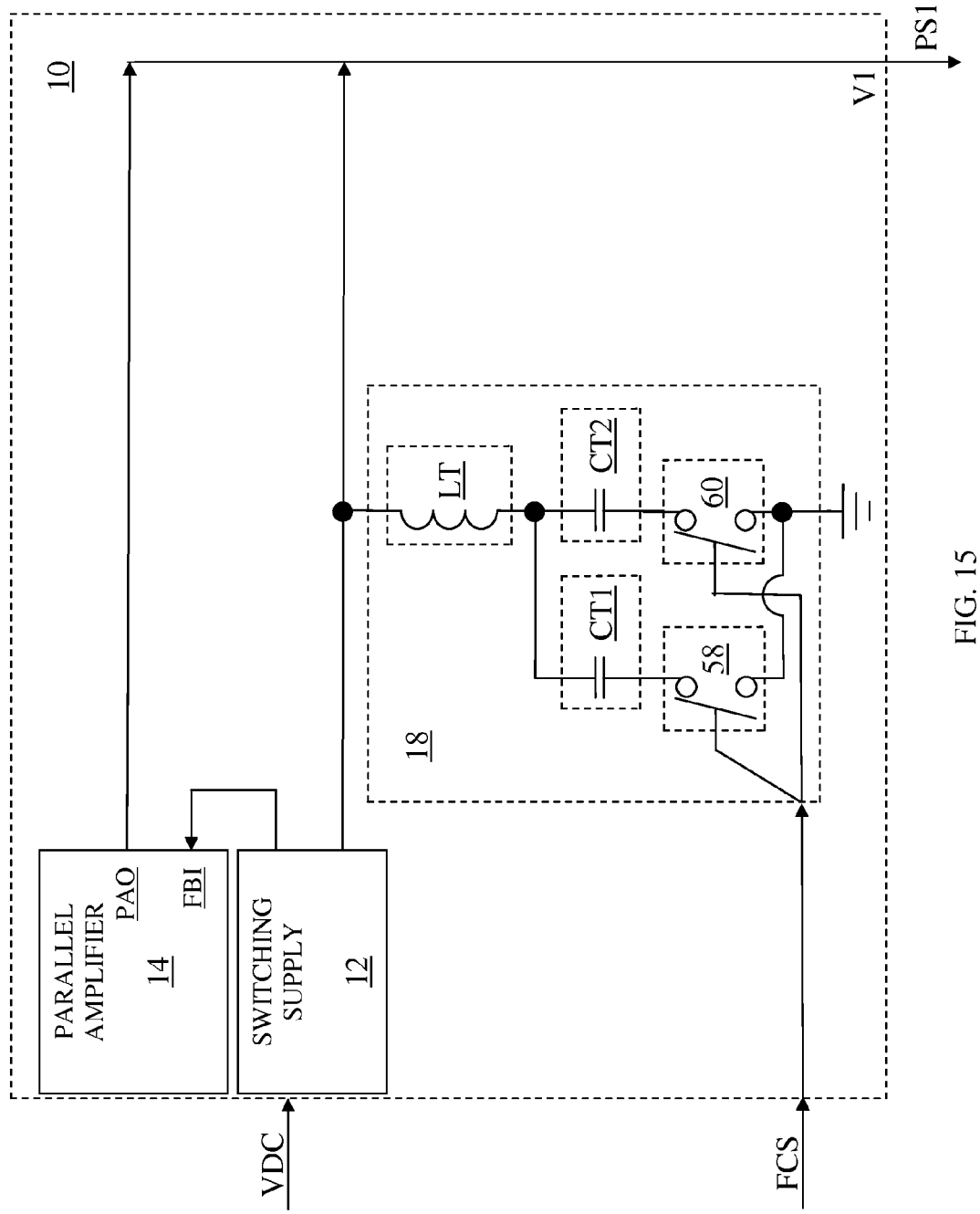
FIG. 15 shows the details of the RF notch filter used in the DC-DC converter illustrated in FIG. 13 according to an alternate embodiment of the RF notch filter.

FIG. 15 shows the details of the RF notch filter 18 used in the DC-DC converter 10 illustrated in FIG. 13 according to an alternate embodiment of the RF notch filter 18. The RF notch filter 18 includes the notch filter inductive element LT, the first notch filter capacitive element CT1, the second notch filter capacitive element CT2, the first switching element 58, and a second switching element 60. The notch filter inductive element LT, the second notch filter capacitive element CT2, and the second switching element 60 are coupled in series between the parallel amplifier output PAO and the ground. The first notch filter capacitive element CT1 and the first switching element 58 are coupled in series to form a series coupling, which is coupled across a series combination of the second notch filter capacitive element CT2 and the second switching element 60.

A control input to the first switching element 58 receives one bit of the filter control signal FCS. A control input to the second switching element 60 receives another bit of the filter control signal FCS. As such, the first switching element 58 is in one of the ON state and the OFF state based on the filter control signal FCS, and the second switching element 60 is in one of an ON state and an OFF state based on the filter control signal FCS. Therefore, the selectable notch frequency is one of a first frequency, a second frequency, and a third frequency. When the first switching element 58 is in the ON state and the second switching element 60 is in the ON state, the selectable notch frequency is based on a combination of the notch filter inductive element LT in series with a parallel combination of the first notch filter capacitive element CT1 and the second notch filter capacitive element CT2. As such, when the first switching element 58 is in the ON state and the second switching element 60 is in the ON state, the selectable notch frequency is the first frequency.

When the first switching element 58 is in the OFF state and the second switching element 60 is in the ON state, the selectable notch frequency is based on a series combination of the notch filter inductive element LT and the second notch filter capacitive element CT2. As such, when the first switching element 58 is in the OFF state and the second switching element 60 is in the ON state, the selectable notch frequency is the second frequency. When the first switching element 58 is in the ON state and the second switching element 60 is in the OFF state, the selectable notch frequency is based on a series combination of the notch filter inductive element LT and the first notch filter capacitive element CT1. As such, when the first switching element 58 is in the ON state and the second switching element 60 is in the OFF state, the selectable notch frequency is the third frequency.

In one embodiment of the RF notch filter 18, the first frequency is equal to about 30 megahertz, the second frequency is equal to about 39 megahertz, and the third frequency is equal to about 47 megahertz. When the first switching element 58 is in the OFF state and the second switching element 60 is in the OFF state, the RF notch filter 18 is disabled.

Figure 16:
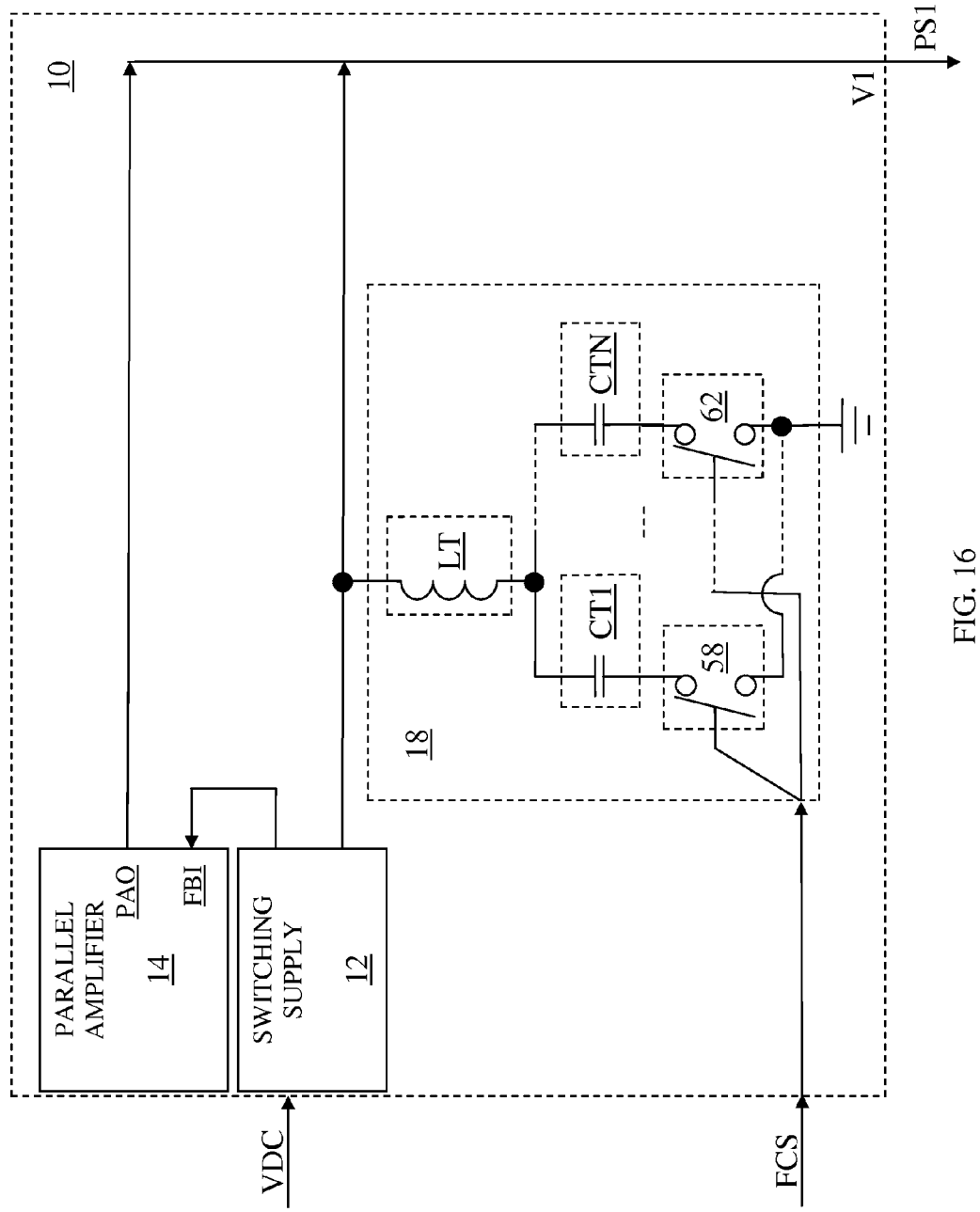
FIG. 16 shows the details of the RF notch filter used in the DC-DC converter illustrated in FIG. 13 according to an additional embodiment of the RF notch filter.

FIG. 16 shows the details of the RF notch filter 18 used in the DC-DC converter 10 illustrated in FIG. 13 according to an additional embodiment of the RF notch filter 18. The RF notch filter 18 includes the notch filter inductive element LT, the first notch filter capacitive element CT1 and up to and including an $N^{TH}$ notch filter capacitive element CTN. The RF notch filter 18 further includes the first switching element 58 and up to and including an $N^{TH}$ switching element 62. The first notch filter capacitive element CT1 and the first switching element 58 are coupled in series to form a first series coupling. The $N^{TH}$ notch filter capacitive element CTN and the $N^{TH}$ switching element 62 are coupled in series to form an Nth series coupling. As such, the RF notch filter 18 includes the first series coupling and up to and including the Nth series coupling to form a group of series couplings, such that each of the group of series couplings is coupled in parallel with one another. As such, the notch filter inductive element LT and the group of series couplings are coupled in series between the parallel amplifier output PAO and the ground.

Figure 17:
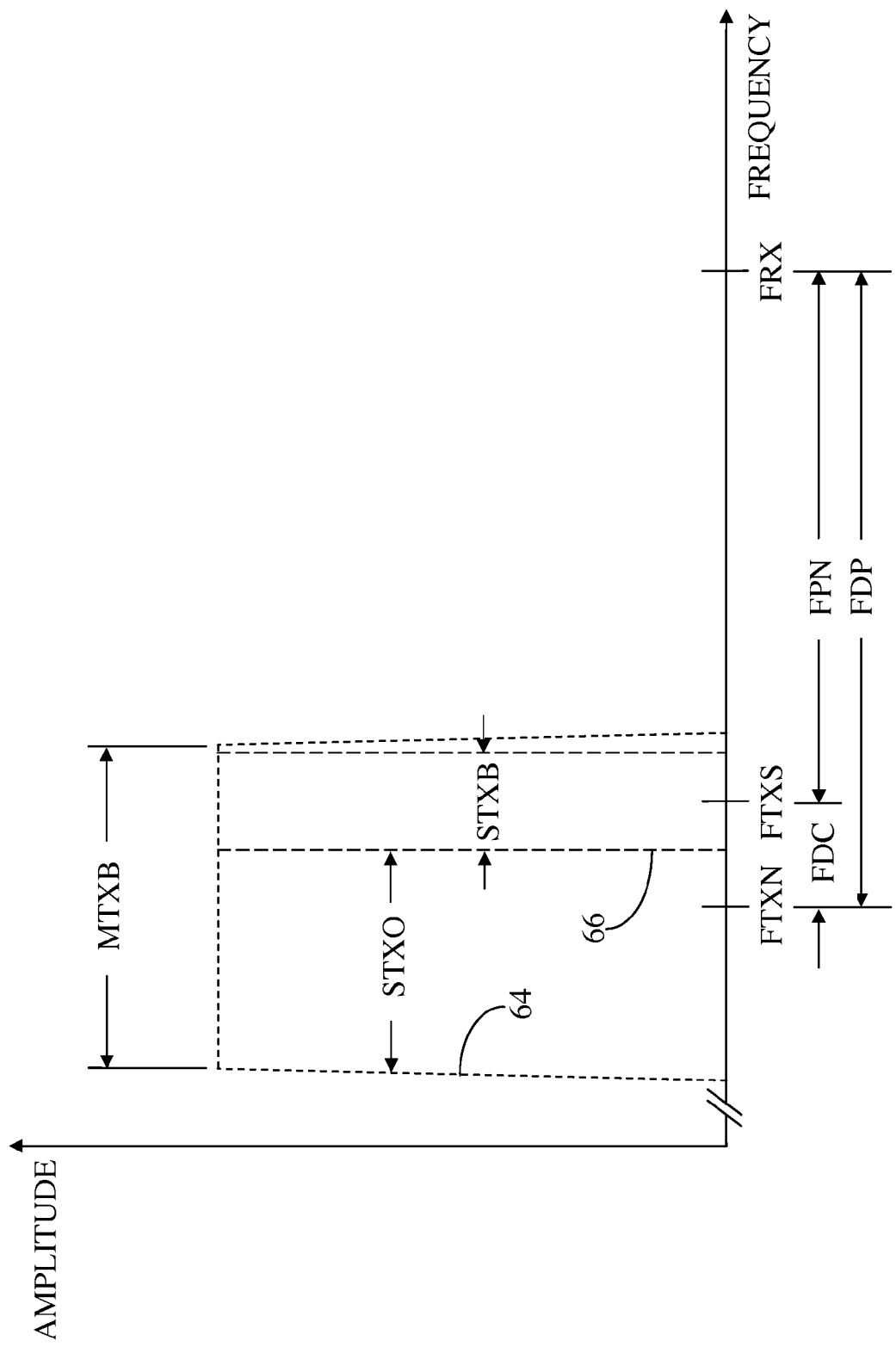
FIG. 17 is a graph illustrating frequency behavior of the RF communications system illustrated in FIG. 12 according to one embodiment of the RF communications system.

FIG. 17 is a graph illustrating frequency behavior of the RF communications system 26 illustrated in FIG. 12 according to one embodiment of the RF communications system 26. The graph illustrated in FIG. 17 shows an RF spectrum associated with the RF transmit signal RFT (FIG. 12) and the RF receive signal RFR (FIG. 12) The RF receive signal RFR (FIG. 12) has an RF receive frequency FRX. In one embodiment of the RF notch frequency RNF (FIG. 3), which is the selectable notch frequency, the selectable notch frequency is selected to reduce noise at the RF receive frequency FRX. In one embodiment of the RF transmit signal RFT (FIG. 12), the RF transmit signal RFT (FIG. 12) is associated with a maximum transmit band 64. In an alternate embodiment of the RF transmit signal RFT (FIG. 12), the RF transmit signal RFT (FIG. 12) is associated with a selected transmit band 66, which is a subset of the maximum transmit band 64.

The maximum transmit band 64 has a maximum transmit bandwidth MTXB and the selected transmit band 66 has a selected transmit bandwidth STXB. The selected transmit bandwidth STXB is less than the maximum transmit bandwidth MTXB. As such, the selected transmit band 66 may be used when the maximum transmit bandwidth MTXB is not required. The maximum transmit band 64 has a nominal RF transmit frequency FTXN, which is in the middle of the maximum transmit band 64. The selected transmit band 66 has a selected RF transmit frequency FTXS, which is in the middle of the selected transmit band 66. A selected transmit start offset STXO identifies the bottom edge of the selected transmit band 66 relative to the bottom edge of the maximum transmit band 64.

An RF duplex frequency FDP is about equal to a difference between the RF receive frequency FRX and the nominal RF transmit frequency FTXN. In one embodiment of the RF notch frequency RNF (FIG. 3), which is the selectable notch frequency, the selectable notch frequency is selected to minimize a difference between the selectable notch frequency and the RF duplex frequency FDP, which may reduce noise at the RF receive frequency FRX. A preferred notch frequency FPN is about equal to a difference between the RF receive frequency FRX and the selected RF transmit frequency FTXS. In one embodiment of the RF notch frequency RNF (FIG. 3), which is the selectable notch frequency, the selectable notch frequency is selected to minimize a difference between the selectable notch frequency and the preferred notch frequency FPN, which may reduce noise at the RF receive frequency FRX.

A duplex frequency correction FDC is about equal to a difference between the nominal RF transmit frequency FTXN and the selected RF transmit frequency FTXS. As such, the duplex frequency correction FDC is about equal to a difference between the preferred notch frequency FPN and the RF duplex frequency FDP. In one embodiment of the selected RF transmit frequency FTXS, the selected RF transmit frequency FTXS is greater than the nominal RF transmit frequency FTXN, as shown in FIG. 17. However, in an alternate embodiment of the selected RF transmit frequency FTXS, the selected RF transmit frequency FTXS is less than the nominal RF transmit frequency FTXN. Therefore, the duplex frequency correction FDC may be positive or negative.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    a parallel amplifier having a parallel amplifier output and configured to regulate a voltage of a first power supply output signal based on a voltage setpoint;
    a switching supply coupled to the parallel amplifier output; and
    a radio frequency (RF) notch filter having a selectable notch frequency and coupled between the parallel amplifier output and a ground, wherein the selectable notch frequency is based on an RF duplex frequency.

2. The circuitry of claim 1 wherein the RF notch filter is a programmable RF notch filter.

3. The circuitry of claim 1 wherein the RF duplex frequency is about equal to a difference between an RF transmit frequency and an RF receive frequency.

4. The circuitry of claim 1 wherein the selectable notch frequency is about equal to the RF duplex frequency.

5. The circuitry of claim 1 wherein transmitter control circuitry is configured to select the selectable notch frequency based on the RF duplex frequency.

6. The circuitry of claim 5 further comprising the transmitter control circuitry.

7. The circuitry of claim 5 wherein selection of the selectable notch frequency is further based on notch frequency information, which is based on the RF duplex frequency.

8. The circuitry of claim 1 further comprising an offset capacitive element, wherein the switching supply is coupled to the parallel amplifier output via the offset capacitive element, and the RF notch filter is coupled to the parallel amplifier output via the offset capacitive element.

9. The circuitry of claim 1 wherein the selectable notch frequency is one of a first frequency and a second frequency.

10. The circuitry of claim 9 wherein the first frequency is equal to about 30 megahertz and the second frequency is equal to about 45 megahertz.

11. The circuitry of claim 1 wherein the selectable notch frequency is one of a first frequency, a second frequency, and a third frequency.

12. The circuitry of claim 11 wherein the first frequency is equal to about 30 megahertz, the second frequency is equal to about 39 megahertz, and the third frequency is equal to about 47 megahertz.

13. The circuitry of claim 1 wherein the RF notch filter is configured to be disabled.

14. The circuitry of claim 1 wherein:
the parallel amplifier is further configured to partially provide the first power supply output signal via the parallel amplifier output based on the voltage setpoint; and
the switching supply is configured to partially provide the first power supply output signal.

15. The circuitry of claim 14 wherein the switching supply is further configured to regulate the first power supply output signal to minimize an output current from the parallel amplifier.

16. The circuitry of claim 1 further comprising a direct current (DC)-DC converter, an RF PA, and RF front-end circuitry, wherein:
the DC-DC converter comprises the parallel amplifier, the switching supply, and the RF notch filter, and is configured to provide a first envelope power supply signal to the RF PA, such that the first envelope power supply signal is configured to at least partially envelope track an RF transmit signal;
the RF PA is configured to receive and amplify an RF input signal to provide the RF transmit signal using the first envelope power supply signal; and
the RF front-end circuitry is configured to provide an RF receive signal, which has an RF receive frequency.

17. The circuitry of claim 16 wherein the first envelope power supply signal provides power for amplification to the RF PA.

18. The circuitry of claim 16 wherein a bandwidth of the first envelope power supply signal is greater than or equal to about 20 megahertz.

19. The circuitry of claim 16 wherein the selectable notch frequency is selected to reduce noise at the RF receive frequency.

20. The circuitry of claim 1 wherein the selectable notch frequency is selected to minimize a difference between the selectable notch frequency and the RF duplex frequency.

21. The circuitry of claim 1 wherein the selectable notch frequency is selected to minimize a difference between the selectable notch frequency and a preferred notch frequency.

22. A method comprising:
providing a first envelope power supply signal to a radio frequency (RF) power amplifier (PA);
at least partially envelope tracking an RF transmit signal;
receiving and amplifying an RF input signal to provide the RF transmit signal using the first envelope power supply signal;
providing an RF receive signal, which has an RF receive frequency; and
RF notch filtering the first envelope power supply signal to reduce noise at the RF receive frequency.

* * * * *